United States Patent
Kim

(10) Patent No.: US 10,177,182 B2
(45) Date of Patent: Jan. 8, 2019

(54) IMAGE SENSOR HAVING SHIELDS AND METHODS OF FABRICATING THE SAME

(71) Applicant: SK hynix Inc., Gyeonggi-do (KR)

(72) Inventor: Sung-Man Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/589,116

(22) Filed: May 8, 2017

(65) Prior Publication Data
US 2018/0114806 A1 Apr. 26, 2018

(30) Foreign Application Priority Data

Oct. 20, 2016 (KR) .................. 10-2016-0136390

(51) Int. Cl.
 *H01L 27/146* (2006.01)
(52) U.S. Cl.
 CPC .... *H01L 27/14603* (2013.01); *H01L 27/1463* (2013.01); *H01L 27/14605* (2013.01); *H01L 27/14621* (2013.01); *H01L 27/14623* (2013.01); *H01L 27/14625* (2013.01); *H01L 27/14627* (2013.01); *H01L 27/14645* (2013.01); *H01L 27/14685* (2013.01); *H01L 27/14689* (2013.01)
(58) Field of Classification Search
 CPC ......... H01L 27/14623; H01L 29/78633; H01L 27/14621; H01L 27/14627; H01L 27/1463; H01L 27/14645; H01L 27/14605; H01L 27/14603; H01L 27/14625; H01L 27/14685; H01L 27/14689

See application file for complete search history.

(56) References Cited

U.S. PATENT DOCUMENTS

| | | | |
|---|---|---|---|
| 2005/0184322 A1* | 8/2005 | Inoue | H01L 27/14601 257/292 |
| 2013/0082267 A1* | 4/2013 | Aichi | H01L 27/1214 257/59 |
| 2014/0347538 A1* | 11/2014 | Toda | H01L 27/14603 348/308 |
| 2015/0162368 A1* | 6/2015 | Egawa | H01L 27/14603 257/432 |
| 2015/0350583 A1* | 12/2015 | Mauritzson | H04N 5/378 250/208.1 |
| 2016/0204150 A1* | 7/2016 | Oh | H01L 27/14623 257/229 |
| 2016/0211306 A1* | 7/2016 | Choi | H01L 27/14638 |
| 2016/0295144 A1* | 10/2016 | Kimura | H01L 27/14603 |

FOREIGN PATENT DOCUMENTS

KR 1020160031462 3/2016

* cited by examiner

*Primary Examiner* — Fei Fei Yeung Lopez
(74) *Attorney, Agent, or Firm* — IP & T Group LLP

(57) ABSTRACT

An image sensor includes: a first sub-pixel and a second sub-pixel that are adjacent to each other; and an upper shield, wherein the first sub-pixel includes a first photodiode and a first storage diode, and the second sub-pixel includes a second photodiode and a second storage diode, and the upper shield is formed over the first and second storage diodes vertically overlap with the first and second storage diodes.

16 Claims, 33 Drawing Sheets

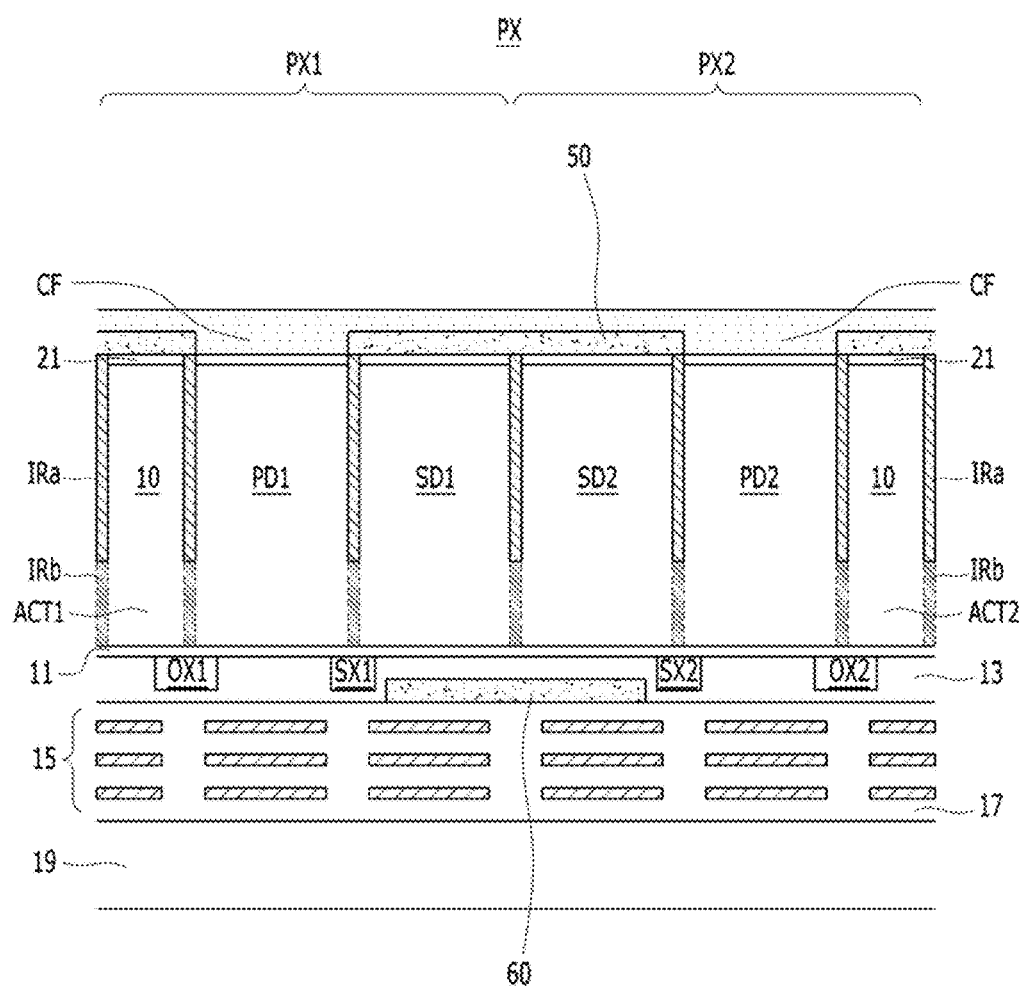

IMAGE SENSOR HAVING SHIELDS AND METHODS OF FABRICATING THE SAME

CROSS-REFERENCE TO RELATED APPLICATIONS

This U.S. non-provisional patent application claims priority under 35 U.S.C. § 119(a) to Korean Patent Application No. 10-2016-0136390, filed on Oct. 20, 2016, in the Korean Intellectual Property Office (KIPO), the disclosure of which is incorporated herein by reference in its entirety.

BACKGROUND

1. Field

Exemplary embodiments of the inventive concepts relate to an image sensor having shields, and a method for fabricating the image sensor.

2. Description of the Related Art

An image sensor is a device that converts an optical image into electrical signals. Recent advancements in the computer industry and the communication industry call for increased demands for high-performance stack-type image sensors in various fields, such as digital cameras, camcorders, Personal Communication Systems (PCS), game players, security cameras, medical micro cameras, robots and so forth.

SUMMARY

Embodiments of the inventive concepts are directed to an image sensor having both an auto-focusing function and a global shutter function.

Embodiments of the inventive concepts are directed to an image sensor having shields that make photodiodes used as storage elements, and a structure of a unit pixel of the image sensor.

Embodiments of the inventive concepts are directed to an image sensor having both auto-focusing function and global shutter function, and a method for forming a structure of a unit pixel of the image sensor.

The objectives of the inventive concepts are not limited to the above-mentioned objectives, and it is obvious to those skilled in the art that there may be other objectives that are not mentioned above.

In accordance with an embodiment of the inventive concepts, an image sensor includes: a first sub-pixel and a second sub-pixel that are adjacent to each other; and an upper shield, wherein the first sub-pixel includes a first photodiode and a first storage diode, and the second sub-pixel includes a second photodiode and a second storage diode, and the upper shield is formed over the first and second storage diodes to vertically overlap with the first and second storage diodes.

The upper shield may do not vertically overlap with the first and second photodiodes.

The image sensor may further include: a lower shield that vertically overlaps with the first and second storage diodes.

The lower shield may do not vertically overlap with the first and second photodiodes.

The first sub-pixel may further include a first active region, and the second sub-pixel may further include a second active region, and the upper shield may be aligned and overlap with the first and second active regions.

The lower shield may do not vertically overlap with the first and second active regions.

The image sensor may further include: a first micro lens vertically overlaps with the first sub-pixel; and a second micro lens vertically overlaps with the second sub-pixel.

The image sensor may further include: a color filter that is shared by the first sub-pixel and the second sub-pixel.

The image sensor may further include: a first storage transfer transistor that is formed over an interface between the first photodiode and the first storage diode; and a second storage transfer transistor that is formed over an interface between the second photodiode and the second storage diode.

The image sensor may further include: an isolation region between the first and second photodiodes and the first and second storage diodes, wherein the isolation region may include an upper isolation region that includes a dielectric material filling trenches which are formed from an upper surface of the substrate to an inside of the substrate.

The isolation region may further include a lower isolation region that is formed from a lower surface of the substrate to the inside of the substrate, and the lower isolation region may include an ion implantation region containing a P-type ion.

In accordance with an exemplary embodiment of the inventive concepts, an image sensor includes: a pixel array including a plurality of pixel sets that are arrayed in a form of matrix, wherein each of the plurality of the pixel sets includes four unit pixels, and each of the four unit pixels includes a first sub-pixel, a second sub-pixel, an upper shield, and a lower shield, and the first sub-pixel includes a first photodiode, a first storage diode, and a first active region, and the second sub-pixel includes a second photodiode, a second storage diode, and a second active region, and the upper shield optically shields upper surfaces of the first and second storage diodes and the first and second active regions, and the lower shield optically shields lower surfaces of the first and second storage diodes.

The four unit pixels may have an arrangement of the first photodiode-the first storage diode-the second storage diode-the second photodiode in a first direction.

The four unit pixels may have an arrangement of the first storage diode-the first photodiode-the second photodiode-the second storage diode in a first direction.

The four unit pixels may have an arrangement of the first photodiode-the first storage diode-the second photodiode-the second storage diode in a first direction.

The four unit pixels may have an arrangement of the first storage diode-the first photodiode-the second storage diode-the second photodiode in a first direction.

The four unit pixels may be arrayed in a form of a checker board shape and share one color filter.

The first photodiode and the first storage diode may share a first micro lens, and the second photodiode and the second storage diode may share a second micro lens.

The first sub-pixel may be disposed in an upper portion of each of the four unit pixels, and the second sub-pixel may be disposed in a lower portion of each of the four unit pixels.

The first photodiode of the first sub-pixel and the second photodiode of the second sub-pixel may be arrayed in a first diagonal direction, and the first storage diode of the first sub-pixel and the second storage diode of the second sub-pixel may be arrayed in a second diagonal direction which is orthogonal to the first diagonal direction.

BRIEF DESCRIPTION OF THE DRAWINGS

The above and other features and advantages of the invention will become more apparent to those skilled in the art to which the invention pertains by the following detailed description with reference to the attached drawings in which:

FIGS. 10A to 10K are longitudinal cross-sectional views illustrating a method for fabricating an image sensor in accordance with an exemplary embodiment of the inventive concepts.

DETAILED DESCRIPTION

Figure 1:
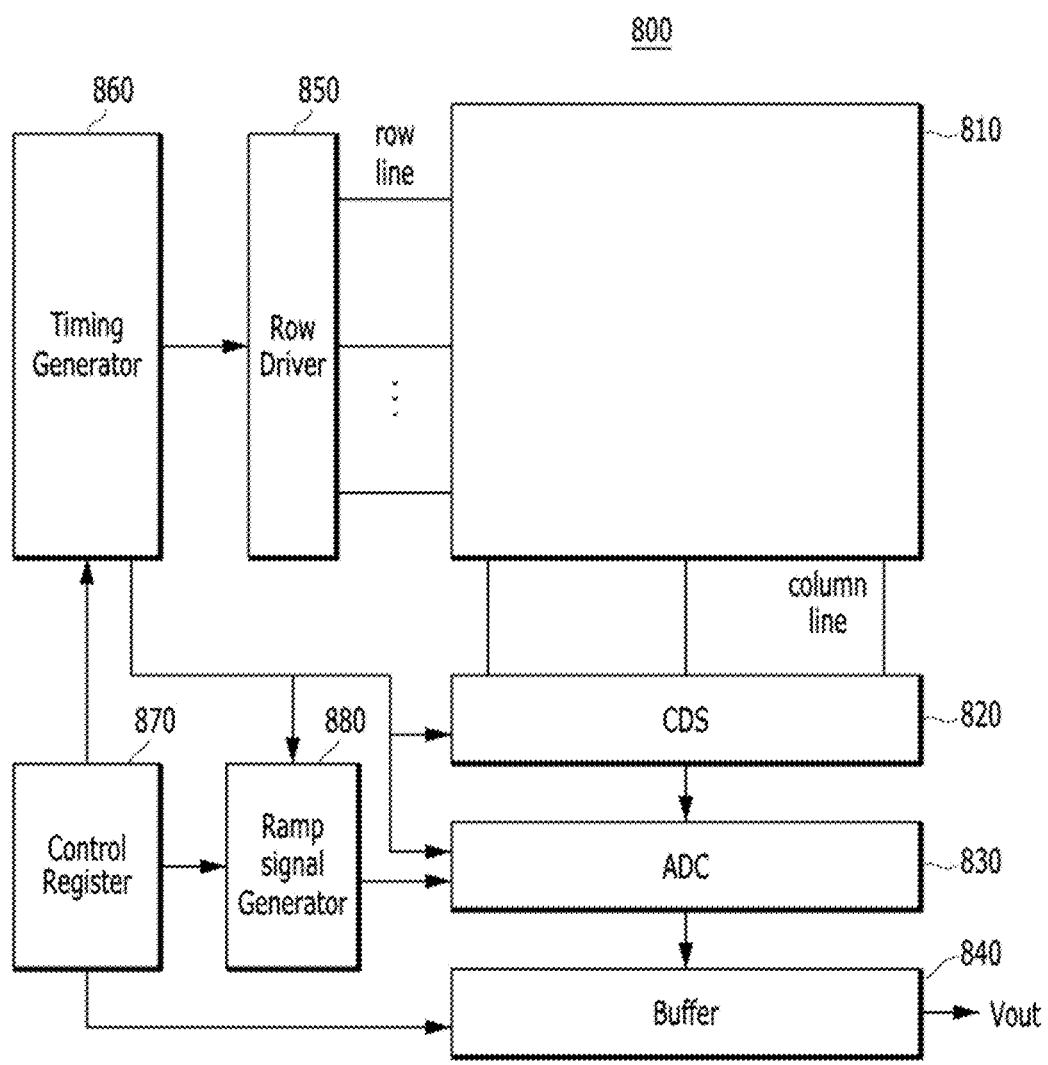
FIG. 1 is a block diagram illustrating an image sensor in accordance with an exemplary embodiment of the inventive concepts.

Exemplary embodiments of the inventive concepts will be described below in more detail with reference to the accompanying drawings. The inventive concepts may, however, be embodied in different forms and should not be construed as limited to the embodiments set forth herein. Rather, these embodiments are provided to make this disclosure thorough and complete, and fully convey the scope of the inventive concepts to those skilled in the art. The spirit and scope of the invention are as defined in the claims.

The terms used in this patent specification are for describing the embodiments of the inventive concepts and they do not limit the scope of the inventive concepts. In this specification, the use of a singular term includes a plural term as well unless specifically mentioned otherwise. The use of the expressions 'comprises' and/or 'includes' a constituent element, step, and/or device in this patent specification does not exclude the presence or addition of another constituent element, step, and/or device.

When an element is described in this specification to be 'connected to' or 'coupled to' another element, the description includes not only a direct connection or coupling but also an indirect connection or coupling where yet another element is interposed between them. On the other hand, when an element is described to be 'directly connected to' or 'directly coupled to' another element, the description means that there are no other elements interposed between them. The expression 'and/or' means each of the mentioned items, and all combinations of one or more of the mentioned items.

When a first layer is referred to as being "on" a second layer or "on" a substrate, it not only refers to a case where the first layer is formed directly on the second layer or the substrate but also a case where a third layer exists between the first layer and the second layer or the substrate.

The terms 'below', 'beneath', 'lower', 'above', and 'upper' are spatially relative words, and they may be used to easily describe the correlation between an element or constituent element and another element or constituent element in the drawings. The spatially relative words have to be construed to include not only the direction illustrated in the drawings but also the different directions when the element is used or operates. For example, when a drawing is reversed, an element that is described to be 'below' or 'beneath' of another element may be disposed above the element.

Also, the embodiments of the inventive concepts described in this specification are described with reference to the exemplary drawings which are cross-sectional views and/or plan views. The drawings are not necessarily to scale and in some instances, proportions may have been exaggerated in order to clearly Illustrate features of the embodiments. Therefore, the forms of the exemplary drawings may be changed due to a fabrication method and/or tolerance. In this respect, the embodiments of the inventive concepts are not limited to the specific forms illustrated in the drawings, but include a variation in the shape formed according to the fabrication process. For example, a region illustrated to have a right angle may be of a shape having a rounded portion or a predetermined curvature. Therefore, the regions shown in the drawings are roughly illustrated, and the shapes of the regions exemplarily Illustrated in the drawings just show specific shapes of the regions of an element and they do not limit the scope of the inventive concepts.

Throughout the disclosure, like reference numerals refer to like parts throughout the various figures and embodiments of the inventive concepts. Therefore, the reference numerals may be referred to and described, although they are not mentioned and/or described in the corresponding drawing. Also, even though a reference numeral does not appear in the corresponding drawing, the constituent element of the reference numeral may be described by referring to other drawings.

In the disclosure, the terms 'front side' and 'back side' are used as terms of relative concepts to easily describe the technological concept of the inventive concepts. Therefore, the terms 'front side' and 'back side' do not refer to particular directions, positions or constituent elements but they may be compatibly used. For example, the 'front side' may be construed as the 'back side', and the 'back side' may be construed as the 'front side'. Therefore, the 'front side' may be referred to as 'a first' and the 'back side' may be referred to as 'a second', and the 'back side' may be referred to as 'a first' and the 'front side' may be referred to as 'a second'. However, the 'front side' and the 'back side' are not used mixed throughout one embodiment of the inventive concepts.

In the disclosure, the expression 'near' means that one among more than two constituent elements of a symmetric concept is disposed relatively close to another particular constituent element. For example, when a first end is described to be disposed near a first side, it may be understood that the first end is disposed closer to the first side than a second end.

Layouts, top views, and bottom views are presented in the disclosure. The top views and bottom views may also be shown upside down or downside up, or rightside left or leftside right.

FIG. 1 is a block diagram illustrating an image sensor 800 in accordance with an exemplary embodiment of the inventive concepts. Referring to FIG. 1, the image sensor 800 in accordance with the embodiment of the inventive concepts may include a pixel array 810, a correlated double sampler (CDS) 820, an analog-to-digital converter (ADC) 830, a buffer 840, a row driver 850, a timing generator 860, a control register 870, and a ramp signal generator 880.

The pixel array 810 may include a plurality of pixels that are arrayed in a matrix structure of a plurality of rows and columns. The pixels may convert optical image information into electrical image signals, and transfer the electrical image signals to the correlative double sampler 820 through column lines. Each pixel may be coupled to a single row line among a plurality of row lines and to a single column line among a plurality of column lines.

The correlative double sampler 820 may hold and sample the electrical image signals transferred from the pixels of the pixel array 810. For example, the correlative double sampler 820 may sample the voltage level of the received electrical image signals and compare them with a reference voltage level according to a clock signal provided by the timing generator 860 in order to generate and transfer analog signals corresponding to the difference of the compared analog signals to the analog-to-digital converter 830.

The analog-to-digital converter 830 may convert the received analog signals into digital signals and transfer the digital signals to the buffer 840.

The buffer 840 may receive the digital signals, latch the digital signals, and sequentially output them to an external image signal processor (not shown). The buffer 840 may include a memory for latching the digital signals, and a sense amplifier for amplifying the digital signals.

The row driver 850 may drive the pixels of the pixel array 810 according to a signal outputted from the timing generator 860. For example, the row driver 850 may generate selecting signals for selecting one row line among a plurality of row lines and/or driving signals for driving one row line among a plurality of row lines.

The timing generator 860 may generate a timing signal for controlling the correlative double sampler 820, the analog-to-digital converter 830, the row driver 850, and the ramp signal generator 880.

The control register 870 may generate control signal(s) for controlling the buffer 840, the timing generator 860, and the ramp signal generator 880.

The ramp signal generator 880 may generate a ramp signal for controlling image signals outputted from the buffer 840 under the control of the timing generator 860.

Figure 2:
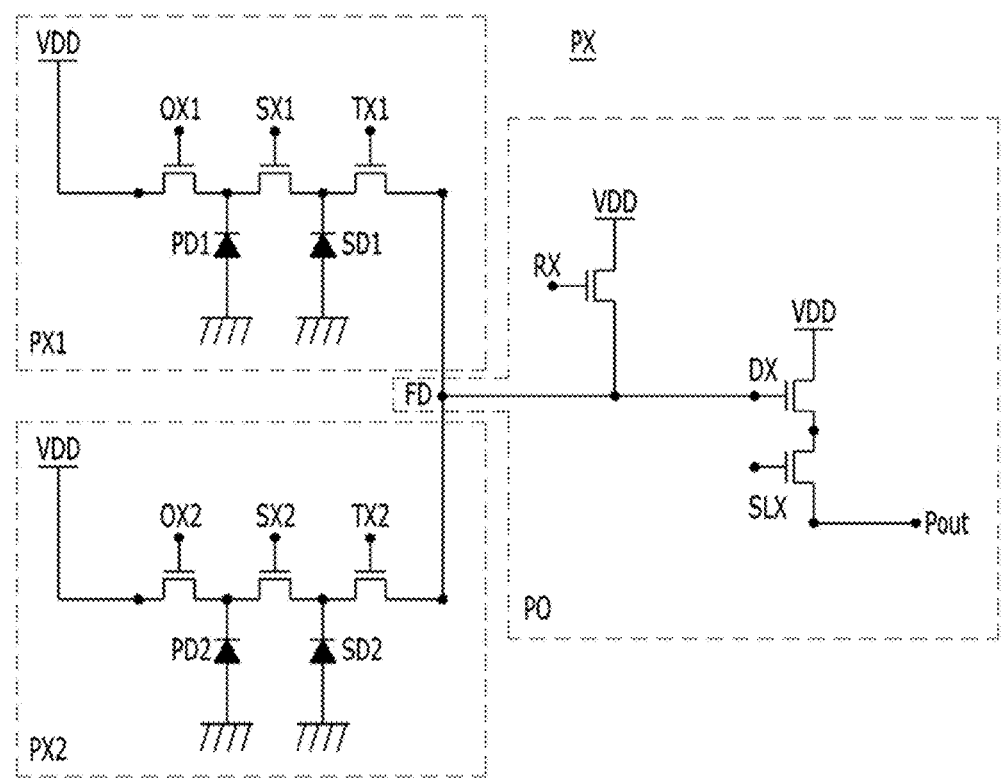
FIG. 2 is an equivalent circuit diagram of a unit pixel of the image sensor in accordance with an exemplary embodiment of the inventive concepts.

FIG. 2 is an equivalent circuit diagram of a unit pixel PX of the image sensor in accordance with an exemplary embodiment of the inventive concepts.

Referring to FIG. 2, the unit pixel PX of the image sensor may include a first sub-pixel PX1, a second sub-pixel PX2, and an output circuit PO.

Each of the first and second sub-pixels PX1 and PX2 may include two diodes PDn and SDn and three transistors OXn, SXn and TXn. Specifically, the first sub-pixel PX1 may include a first photodiode PD1, a first storage diode SD1, a first over-flow transistor OX1, a first storage transfer transistor SX1, and a first transfer transistor TX1. The second sub-pixel PX2 may include a second photodiode PD2, a second storage diode SD2, a second over-flow transistor OX2, a second storage transfer transistor SX2, and a second transfer transistor TX2. The output circuit PO may include a floating diffusion FD, a reset transistor RX, a drive transistor DX, a select transistor SLX, and an output port Pout.

The first photodiode PD1 and the second photodiode PD2 may receive light and generate an electron-hole pair. The first and second over-flow transistors OX1 and OX2 may discharge the excess electrons that are generated in the inside of the first and second photodiode PD1 and PD2 or reset the first and second photodiode PD1 and PD2.

The first and second storage transfer transistors SX1 and SX2 may transfer the electrons generated in the first and second photodiode PD1 and PD2 to the first and second storage diodes SD1 and SD2, respectively, for example, to cathodes of the first and second storage diodes SD1 and SD2.

The first and second storage diodes SD1 and SD2 may temporarily keep the electrons transferred from the first and second photodiodes PD1 and PD2 through the first and second storage transfer transistors SX1 and SX2, respectively.

The first and second transfer transistors TX1 and TX2 may transfer the electrons that are kept in the inside of the first and second storage diodes SD1 and SD2 to the floating diffusion FD.

The electrons transferred to the floating diffusion FD may turn on the drive transistor DX. The drive transistor DX may output electrical signals based on the amount of the electrons of the floating diffusion FD. The electrical signals passing through the drive transistor DX may go through the select transistor SX to be outputted to the output port Pout.

After the electrical signals are outputted from the output port Pout, the floating diffusion FD may be reset by the reset transistor RX to an Initial voltage level, e.g., a power source voltage VDD.

Since the unit pixel PX of the image sensor in accordance with the embodiment of the inventive concepts may temporarily store or output the electrons by using the first and second storage diodes SD1 and SD2, the unit pixel PX may have the global shutter function.

In short, the image sensor in accordance with the described embodiment of FIG. 2 may have both an auto-focusing function and a global shutter function.

Figure 3A:
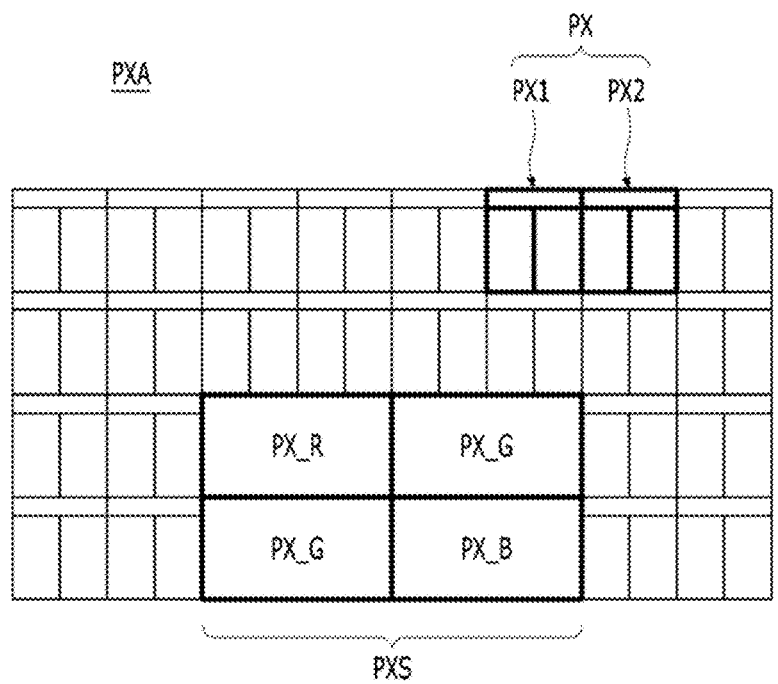
FIG. 3A is a conceptual layout of an upper surface or a conceptual top view of a pixel array of the image sensor in accordance with an exemplary embodiment of the inventive concepts.

FIG. 3A is a conceptual layout of an upper surface or a conceptual top view of a pixel array PXA of the image sensor in accordance with an exemplary embodiment of the inventive concepts.

Referring to FIG. 3A, the pixel array PXA of the image sensor in accordance with the embodiment of the inventive concepts may include a plurality of pixel sets PXS that are arrayed in the form of matrix. Each of the pixel sets PXS may include four unit pixels PX_R, PX_G and PX_B that are arrayed in a 4-bay form. To be specific, the four unit pixels PX_R, PX_G and PX_B may include an upper left unit pixel, a lower left unit pixel, an upper right unit pixel, and a lower right unit pixel that are arrayed in a checker board form or a 4-window form. One pixel set PXS may include one red unit pixel PX_R, one blue unit pixel PX_B, and two green unit pixels PX_G. Therefore, one unit pixel PX may share the same color filter.

Figure 3B:
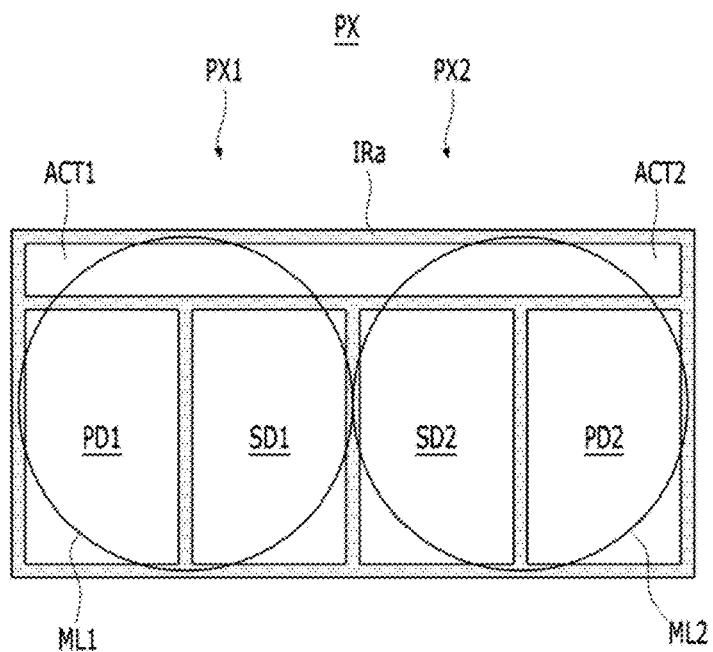
FIG. 3B is a magnified layout of an upper surface or a magnified top view of a unit pixel of the image sensor in accordance with an exemplary embodiment of the inventive concepts.

FIG. 3B is a magnified layout of an upper surface or a magnified top view of a unit pixel PX of the image sensor in accordance with an exemplary embodiment of the inventive concepts. To help understanding the technological concept of the inventive concepts, the first sub-pixel PX1 and the second sub-pixel PX2 and a first micro lens ML1 and a second micro lens ML2 respectively overlapping with the first sub-pixel PX1 and the second sub-pixel PX2 are shown.

Referring to FIG. 3B, each unit pixel PX of the image sensor in accordance with the embodiment of the inventive concepts may include the first sub-pixel PX1 arrayed on the left side, the second sub-pixel PX2 arrayed on the right side, and an upper isolation region IRa. The first sub-pixel PX1 may include the first photodiode PD1, the first storage diode SD1, and a first active region ACT1. The second sub-pixel PX2 may include the second photodiode PD2, the second storage diode SD2, and a second active array ACT2. In the first sub-pixel PX1, the first photodiode PD1 may be arrayed to be distant from the second sub-pixel PX2 while the first storage diode SD1 may be arrayed close to the second sub-pixel PX2. Also, in the second sub-pixel PX2, the second photodiode PD2 may be arrayed to be distant from the first sub-pixel PX1, and the second storage diode SD2 may be arrayed close to the first sub-pixel PX1. In other words, the first photodiode PD1 and the second photodiode PD2 may be arrayed to be distant from each other, and the first storage diode SD1 and the second storage diode SD2 may be arrayed close to each other. For example, as illustrated in FIG. 3B, the unit pixel PX may have an arrangement wherein the first photodiode PD1, the first storage diode SD1, the second storage diode SD2 and the second photodiode PD2 are arranged consecutively in this order in a row direction. According to this arrangement, in the unit pixel PX of the image sensor the first photodiode PD1 and the second photodiode PD2 are arrayed to be distant from one another with one sided toward the left side and other one toward the right side, thus allowing the auto-focusing function to be performed.

The first sub-pixel PX1 and the second sub-pixel PX2 may be arrayed in a left and right mirroring form, for example, in a left and right linear symmetric form along a row direction. More specific, the first and second photodiodes PD1 and PD2 are arrayed in the exterior, the first and second storage diodes SD1 and SD2 arrayed in the interior, and the first and second active arrays ACT1 and ACT2 arrayed in the upper side of the unit pixel PX. In the top view, the first and second active arrays ACT1 and ACT2 may be integrated into one.

The first sub-pixel PX1 and the second sub-pixel PX2 may be optically and electrically isolated from each other by the upper isolation region IRa. For example, the first photodiode PD1 and the first storage diode SD1 may be optically and electrically isolated from each other by the upper isolation region IRa. Also, the second photodiode PD2 and the second storage diode SD2 may be separated by the upper isolation region IRa. The first active array ACT1 and the second active array ACT2 may not be separated by the upper isolation region IRa but integrated into a single active region extending in the row direction along the whole length of the unit pixel PX one. The first sub-pixel PX1 and the second sub-pixel PX2 may be independently aligned and overlap with first and second micro lenses ML1 and ML2, respectively. The first and second micro lenses ML1 and ML2 may have a circular shape as viewed from the top and may be centrally positioned over the respective first and second sub-pixels PX1 and PX2. As illustrated in the embodiment of FIG. 3B, a first micro lens ML1 only overlaps with the first sub-pixel PX1 while the second micro lens ML2 only overlaps with the second sub-pixel PX2. It is further noted, that in the illustrated embodiment of FIG. 3B, the sub-pixels PX1 and PX2 have a rectangular shape from a top view, hence, the overlapping with the respective circular micro-lenses M1 and M2 is partial with some small regions of the sub-pixels PX1 and PX2 not being overlapped.

The upper isolation region IRa may define the unit pixel PX. In other words, the upper isolation region IRa may optically and electrically isolate the unit pixels PXs illustrated in FIG. 3A from each other. The upper isolation area IRa may also, as shown in FIG. 3B, isolate each photodiode from its adjacent storage diode (e.g., PD1 from SD1, and PD2 from SD2), each storage diode from its adjacent storage diode (e.g. SD1 from SD2), and the active regions ACT1 and ACT2 from their respective photodiodes and storage diodes (e.g., ACT1 from PD1 and SD1, and ACT2 from SD2 and PD2).

The upper isolation region IRa as viewed from a top view as illustrated in FIG. 3B may have the shape of a net surrounding four rectangular regions which are arranged in a single row direction corresponding to the first photodiode PX1, the first storage SD1, the second storage diode SD2 and the second photodiode PD2 in the recited order, and one elongated rectangular region corresponding to a continuous active region including the first and second active, equally sized regions ACT1 and ACT2 of the unit pixel PX in the recited order along the whole length of the unit pixel PX in the row direction.

Figure 3C:
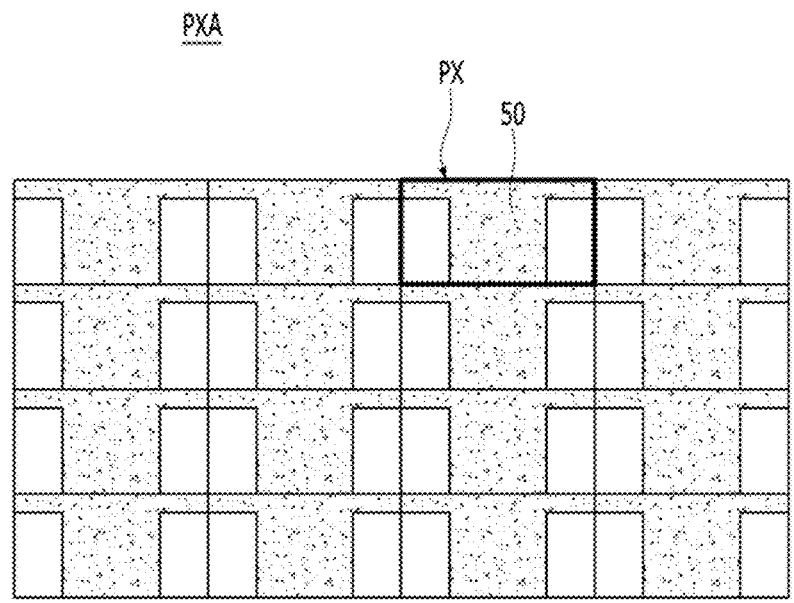
FIG. 3C is a conceptual layout of an upper surface or a conceptual top view of an upper shield in the image sensor in accordance with an exemplary embodiment of the inventive concepts.

FIG. 3C is a conceptual layout of an upper surface or a conceptual top view of an upper shield 50 in the image sensor in accordance with an exemplary embodiment of the inventive concepts. Referring to FIGS. 3B and 3C, the upper shield 50 in the image sensor in accordance with the embodiment of the inventive concepts may be aligned and overlap with the first and second storage diodes SD1 and SD2 and the first and second active arrays ACT1 and ACT2 of each unit pixel PX. In short, the upper shield 50 may physically cover and optically shield the first and second storage diodes SD1 and SD2 and the first and second active arrays ACT1 and ACT2 of each unit pixel PX.

Figure 3D:
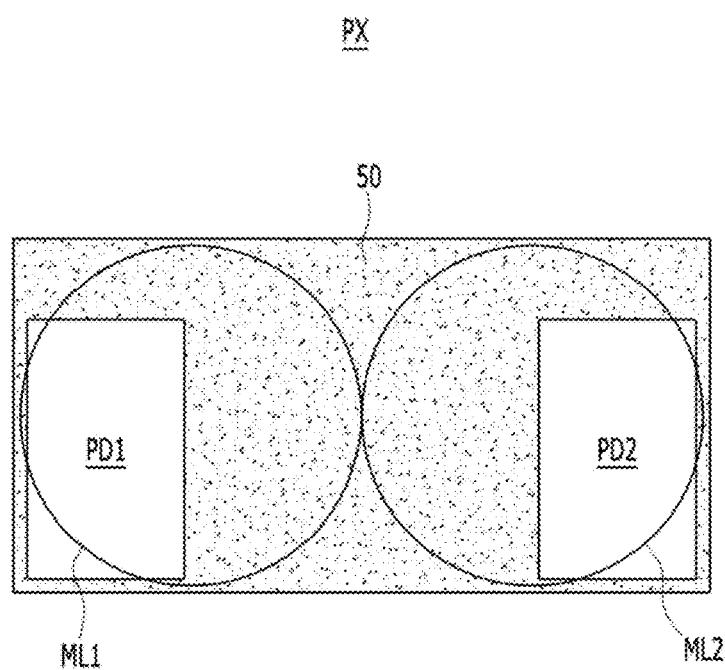
FIG. 3D illustrates the unit pixel, the upper shield, and micro lenses that overlap one with another in the image sensor in accordance with an exemplary embodiment of the inventive concepts.

FIG. 3D illustrates the unit pixel PX, the upper shield 50, and the first and second circular micro lenses ML1 and ML2 that are positioned centrally over their respective sub-pixels PX1 and PX2 in accordance with an exemplary embodiment of the inventive concepts. Referring to FIG. 3D, the first and second photodiodes PD1 and PD2 of the unit pixel PX are not covered by the upper shield 50 but are physically opened and optically exposed.

Figure 3E:
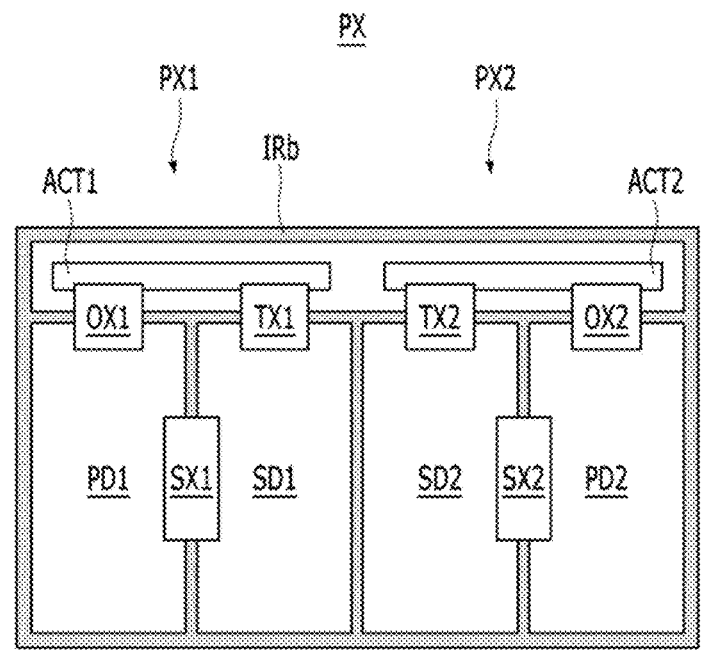
FIG. 3E is a magnified bottom view of the unit pixel in the image sensor in accordance with an exemplary embodiment of the inventive concepts.

FIG. 3E is a magnified bottom view of the unit pixel PX in the image sensor in accordance with an exemplary embodiment of the inventive concepts. Referring to FIG. 3E, the unit pixel PX may include the first sub-pixel PX1, the second sub-pixel PX2, and a lower isolation region IRb. The actual form may be what the drawing is turned upside down or leftside right, but the embodiment of the inventive concepts is described by turning the upside down or leftside down to help understanding the technological concept of the inventive concepts.

The first sub-pixel PX1 may include the first photodiode PD1, the first storage diode SD1, the first active region ACT1, the first storage transfer transistor SX1, the first over-flow transistor OX1, and the first transfer transistor TX1. The second sub-pixel PX2 may Include the second photodiode PD2, the second storage diode SD2, the second active region ACT2, the second storage transfer transistor SX2, the second over-flow transistor OX2, and the second transfer transistor TX2.

The first and second photodiodes PD1 and PD2, the first and second storage diodes SD1 and SD2, and the first and second active regions ACT1 and ACT2 may each be optically and electrically isolated by the lower isolation region IRb. According to an embodiment of the inventive concepts, the first and second active regions ACT1 and ACT2 may be integrated into one. The first and second active regions ACT1 and ACT2 may include a source/drain region, a floating diffusion, and/or a contact region.

The first storage transfer transistor SX1 may traverse a portion of the lower isolation region IRb and overlap with a portion of the first photodiode PD1 and a portion of the first storage diode SD1. The second storage transfer transistor SX2 may traverse a portion of the lower isolation region IRb and overlap with a portion of the second photodiode PD2 and a portion of the second storage diode SD2. As described earlier, the first and second storage transfer transistors SX1 and SX2 may transfer the electrons inside the first and second photodiodes PD1 and PD2 to the first and second storage diodes SD1 and SD2, respectively. Also, the first and second over-flow transistors OX1 and OX2 may discharge the excessive amount of electrons in the inside of the first and second photodiodes PD1 and PD2 to the first and second active regions ACT1 and ACT2 or reset the first and second photodiodes PD1 and PD2 respectively, and the first and second transfer transistors TX1 and TX2 may transfer the electrons in the inside of the first and second storage diodes SD1 and SD2 to the floating diffusion, for example, the first and second active regions ACT1 and ACT2, respectively.

The lower isolation region IRb may be an ion implanted region, a Shallow Trench Isolation (STI) region, or a gap between the constituent elements. For example, the lower isolation region IRb may be the gap between the diodes PD1, PD2, SD1 and SD2 and/or the gap between the diodes PD1, PD2, SD1 and SD2 and the first and second active regions ACT1 and ACT2. In short, the lower isolation region IRb may be a portion of a substrate.

Figure 3F:
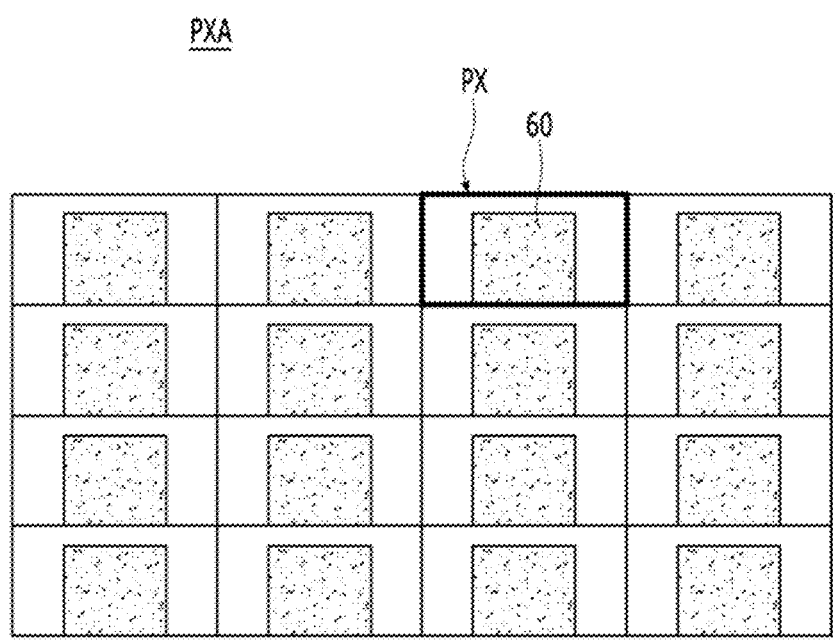
FIG. 3F is a conceptual layout of a lower surface or a conceptual bottom view of a lower shield in the image sensor in accordance with an exemplary embodiment of the inventive concepts.

FIG. 3F is a conceptual layout of a lower surface or a conceptual bottom view of a lower shield 60 in the image sensor in accordance with an exemplary embodiment of the inventive concepts. Referring to FIGS. 3E and 3F, the lower shield 60 in the image sensor may be aligned and overlap with the first and second storage diodes SD1 and SD2. In short, the lower shield 60 may physically cover and optically shield the first and second storage diodes SD1 and SD2. In other words, the lower shield 60 may leave physically open and optically exposed the first and second photodiodes PD1 and PD2 and the first and second active regions ACT1 and ACT2.

Figure 3G:
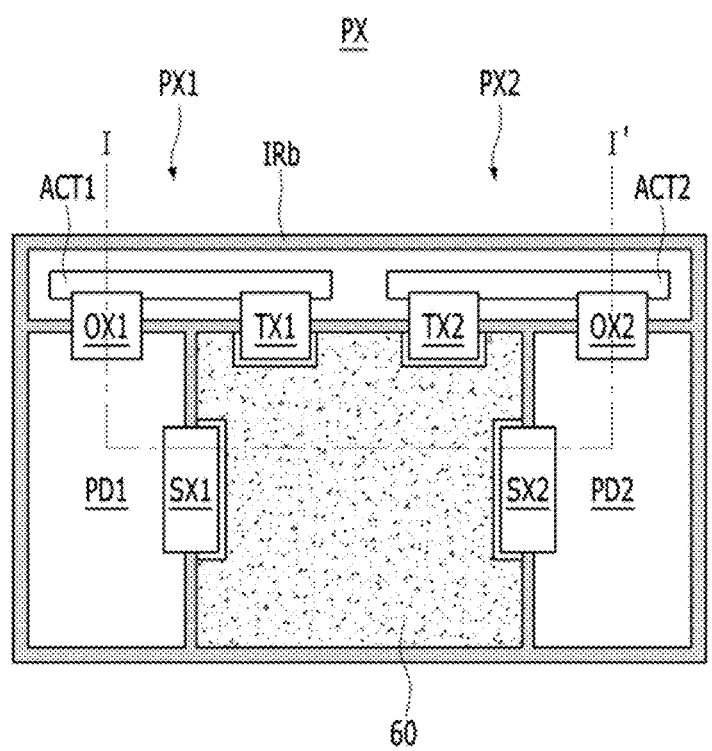
FIG. 3G is a bottom view Illustrating the unit pixel overlapping with the bottom shield in the image sensor in accordance with an exemplary embodiment of the inventive concepts.

FIG. 3G is a bottom view illustrating the unit pixel PX overlapping with the bottom shield 60 in the image sensor in accordance with an exemplary embodiment of the inventive concepts. Referring to FIG. 3G, the lower shield 60 may be aligned and overlap with the first and second storage diodes SD1 and SD2 to physically cover and optically shield the first and second storage diodes SD1 and SD2. The first and second photodiodes PD1 and PD2 and the first and second active regions ACT1 and ACT2 may not overlap with the lower shield 60. In addition, the lower shield 60 may not overlap with the first and second storage transfer transistors SX1 and SX2 and the first and second transfer transistors TX1 and TX2 but leave physically open and optically exposed the first and second storage transfer transistors SX1 and SX2 and the first and second transfer transistors TX1 and TX2.

Figure 4:
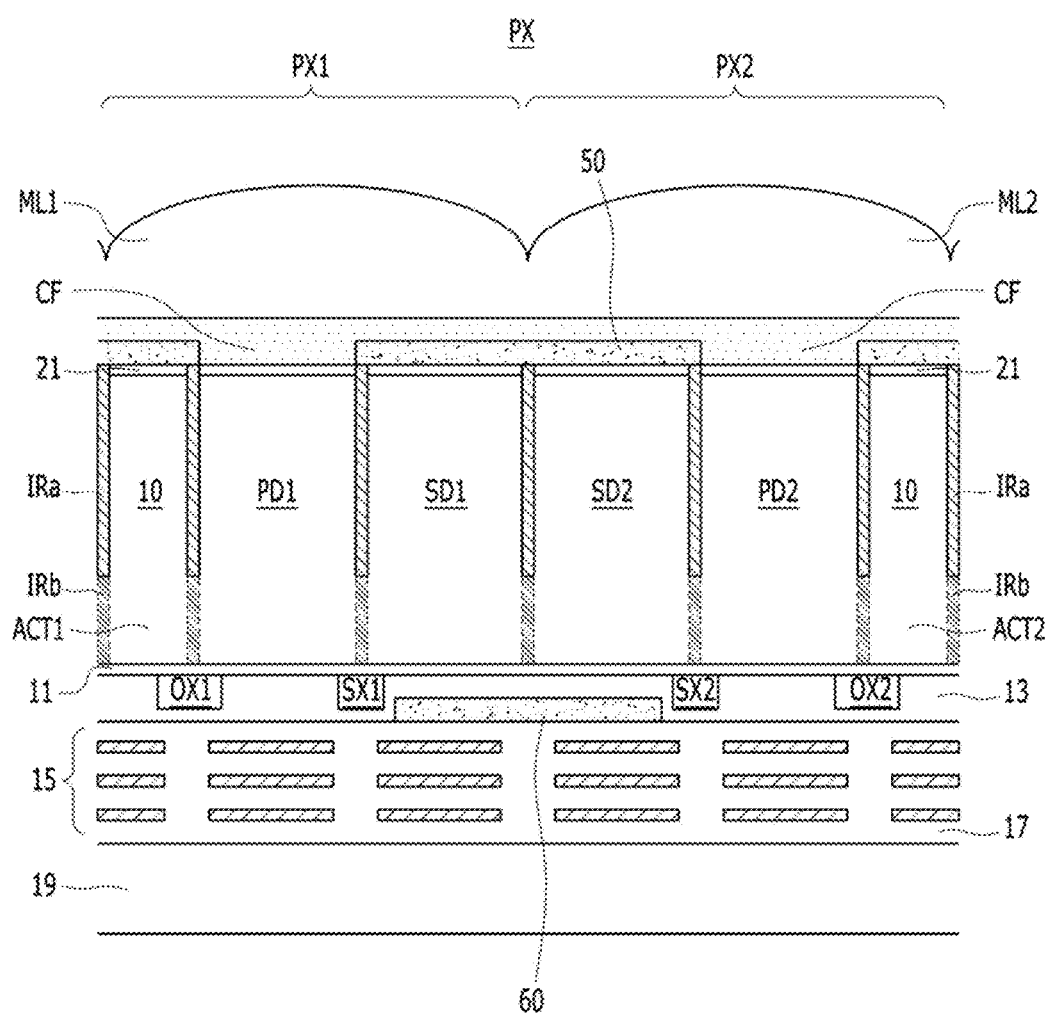
FIG. 4 is a conceptual longitudinal cross-sectional view illustrating the unit pixel of the image sensor taken along a line I-I' of FIG. 3G in accordance with an exemplary embodiment of the inventive concepts.

FIG. 4 is a longitudinal cross-sectional view of the image sensor taken along a line I-I' shown in FIG. 3G, in accordance with an exemplary embodiment of the inventive concepts.

Referring to FIG. 4, the unit pixel PX of the image sensor may include the first sub-pixel PX1 and the second sub-pixel PX2. The first sub-pixel PX1 and the second sub-pixel PX2 may, respectively, include the first and second photodiodes PD1 and PD2, the first and second storage diodes SD1 and SD2, the first and second active regions ACT1 and ACT2, and the upper and lower isolation regions IRa and IRb that are formed in the inside of the substrate 10; a lower dielectric layer 11, the transistors OX1, OX2, SX1 and SX2, the lower shield 60, a lower Inter-layer dielectric layer 13, metal lines 15, an upper inter-layer dielectric layer 17, and a lower device 19 that are formed under a lower surface of the substrate 10; and an upper dielectric layer 21, the upper shield 50, a color filter CF, and the first and second micro lenses ML1 and ML2 that are formed over an upper surface of the substrate 10.

The first and second photodiodes PD1 and PD2 and the first and second storage diodes SD1 and SD2 may have the same structure. For example, the first and second photodiodes PD1 and PD2 and the first and second storage diodes SD1 and SD2 may include an N-type bulk area which includes N-type ions such as phosphorous (P) or arsenic (As), and an outskirt area which includes P-type ions such as boron (B). The outskirt area may include regions adjacent to the lower dielectric layer 11 and regions adjacent to the upper isolation region IRa. In an exemplary embodiment of the inventive concept, the outskirt area may include regions adjacent to the upper dielectric layer 21.

The first and second active regions ACT1 and ACT2 may be defined by the lower isolation region IRb and/or the shallow trench isolation (STI) region. The first and second active regions ACT1 and ACT2 may include N-type ions and/or P-type ions. In an exemplary embodiment of the inventive concept, the first and second active regions ACT1 and ACT2 may include P-type impurities.

The upper isolation region IRa may include a Deep Trench Isolation (DTI) region. For example, the upper isolation region IRa may include a dielectric material filling trenches that are formed in the inside of the substrate 10 from the upper surface of the substrate 10. Therefore, the upper isolation region IRa may electrically isolate the first and second photodiodes PD1 and PD2 and the first and second storage diodes SD1 and SD2.

The lower isolation region IRb may be an ion implanted region. For example, the lower isolation region IRb may include the P-type implanted Ions. Therefore, the lower isolation region IRb may shut off the migration of electrons between the diodes PD1, PD2, SD1 and SD2. A portion of the lower isolation region IRb may be used as a portion of channels of the transistors OX1, OX2, SX1 and SX2.

The lower dielectric layer 11 may include a silicon oxide or a metal oxide.

The first and second over-flow transistors OX1 and OX2 may, respectively, discharge the excessive electrons of the first and second photodiodes PD1 and PD2 to the first and second active regions ACT1 and ACT2. The first and second storage transfer transistors SX1 and SX2 may, respectively, transfer the electrons inside the first and second photodiodes PD1 and PD2 to the first and second storage diodes SD1 and SD2.

The lower shield 60 may be vertically aligned and overlap with the first and second storage diodes SD1 and SD2. The lower shield 60 may prevent and block light from entering the first and second storage diodes SD1 and SD2. The lower shield 60 may be optically opaque. For example, the lower shield 60 may include a metal, such as tungsten (W), or an opaque inorganic material.

The lower inter-layer dielectric layer 13 may cover the transistors OX1, OX2, SX1 and SX2 and the lower dielectric layer 11. The lower inter-layer dielectric layer 13 may cover the upper surface and sides of the lower shield 60. Also, the lower surface of the lower inter-layer dielectric layer 13 may be at the same level as the lower surface of the lower shield 60. The lower inter-layer dielectric layer 13 may Include a silicon oxide, a silicon nitride, a silicon oxynitride, or a combination thereof.

The metal lines 15 may be formed over the lower inter-layer dielectric layer 13 in multiple layers formed inside the upper inter-layer dielectric layer 17, each layer including a plurality of lines of metal lines 15 so that each line is surrounded by the upper Inter-layer dielectric layer 17 material. The metal lines 15 may transfer electrical signals in a horizontal direction. FIG. 4, shows, as an example, three layers of metal lines 15 formed in the upper interlayer dielectric layer 17 forming six columns with three metal lines in each column.

The upper inter-layer dielectric layer 17 may surround the metal lines 15 and the surface of the lower inter-layer dielectric layer 13. The upper inter-layer dielectric layer 17 may include a silicon oxide, a silicon nitride, a silicon oxynitride, or a combination thereof.

The lower device 19 may include a silicon oxide layer or a silicon layer. For example, the lower device 19 may include logic circuits capable of processing the electrical signals just like an image process or the correlated double sampler may do.

The upper dielectric layer 21 may cover the surface of the substrate 10, that is, the upper dielectric layer 21 may cover the surfaces of the diodes PD1, PD2, SD1 and SD2. The upper dielectric layer 21 may include a dielectric material, such as a silicon oxide, a silicon nitride, a silicon oxynitride, or a combination thereof. The upper dielectric layer 21 may decrease white spot defects or dark current of the image sensor by preventing reflection or capturing charges.

The upper shield 50 may be formed over the upper dielectric layer 21 to be vertically aligned and overlap with the first and second storage diodes SD1 and SD2 and the first and second active regions ACT1 and ACT2. The upper shield 50 may prevent and block light from entering the first and second storage diodes SD1 and SD2. The upper shield 50 may be optically opaque. For example, the upper shield 50 may include a metal, such as tungsten (W), or an opaque inorganic material.

The color filter CF may be formed over the first and second photodiodes PD1 and PD2 that are open and the upper shield 50 to be horizontally extended. The first sub-pixel PX1 and the second sub-pixel PX2 may share one color filter CF. In other words, the unit pixel PX may have the same color. Another unit pixel positioned adjacent to the unit pixel PX may have a color filter of a different color.

The first and second micro lenses ML1 and ML2 may be formed to overlap only with the first and second sub-pixels PX1 and PX2, respectively. In other words, the first micro lens ML1 may be formed over the color filter CF of the first sub-pixel PX1 to be aligned and overlap with the first photodiode PD1, the first storage diode SD1, and the first active region ACT1 of the first sub-pixel PX1. The second micro lens ML2 may be formed over the color filter CF of the second sub-pixel PX2 to be aligned and overlap with the second photodiode PD2, the second storage diode SD2, and the second active region ACT2 of the second sub-pixel PX2.

Figure 5A:
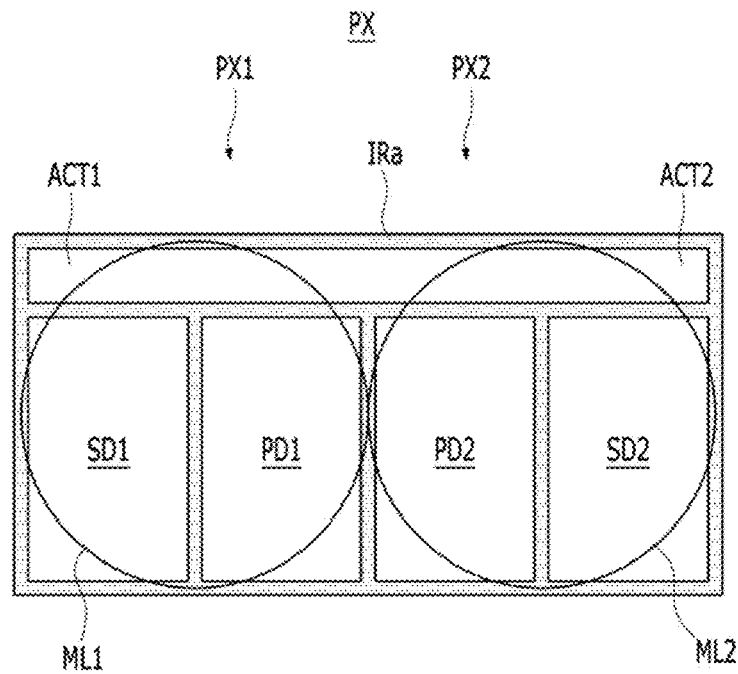
FIG. 5A is a magnified top view of the unit pixel in the image sensor in accordance with an exemplary embodiment of the inventive concepts.
Figure 5B:
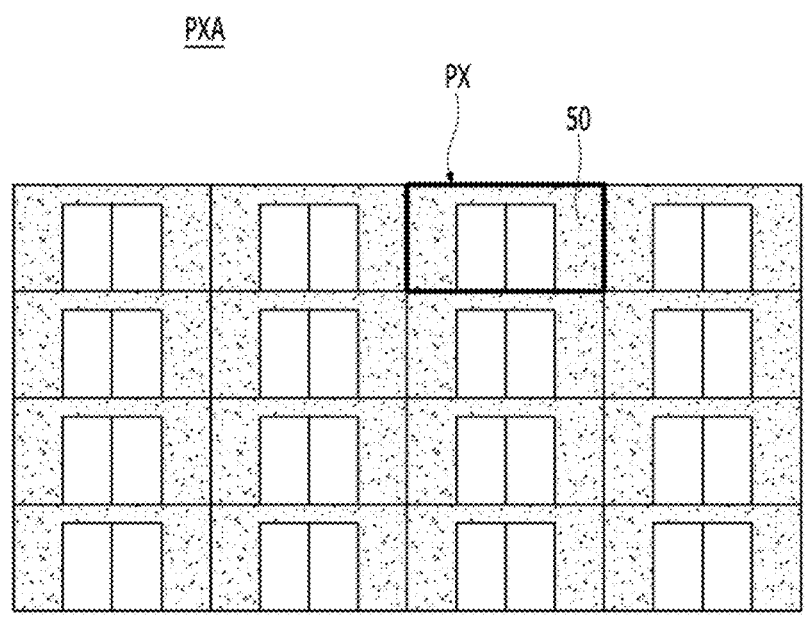
FIG. 5B is a top view of the upper shield of the unit pixel in the image sensor in accordance with an exemplary embodiment of the inventive concepts.
Figure 5C:
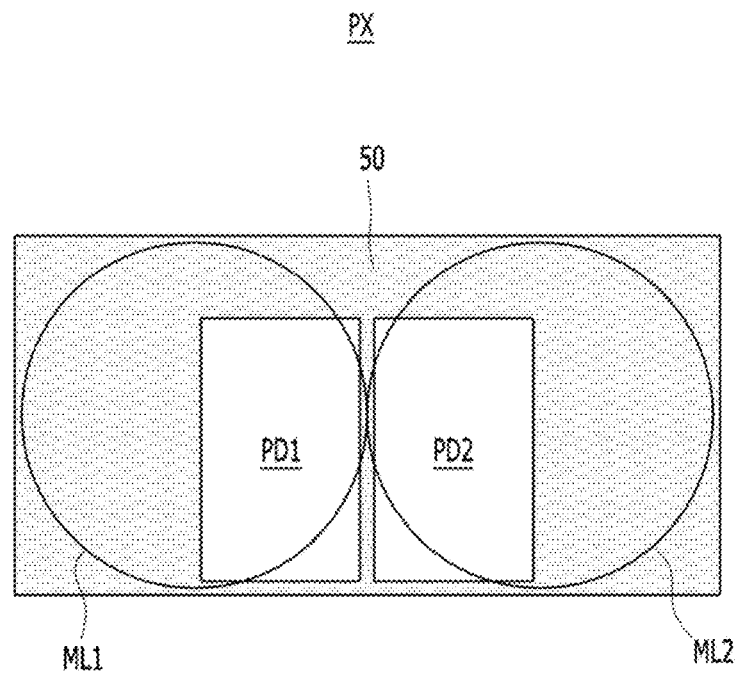
FIG. 5C is a top view showing the unit pixel, the upper shield, and micro lenses that overlap one with another in the image sensor in accordance with an exemplary embodiment of the inventive concepts.
Figure 5D:
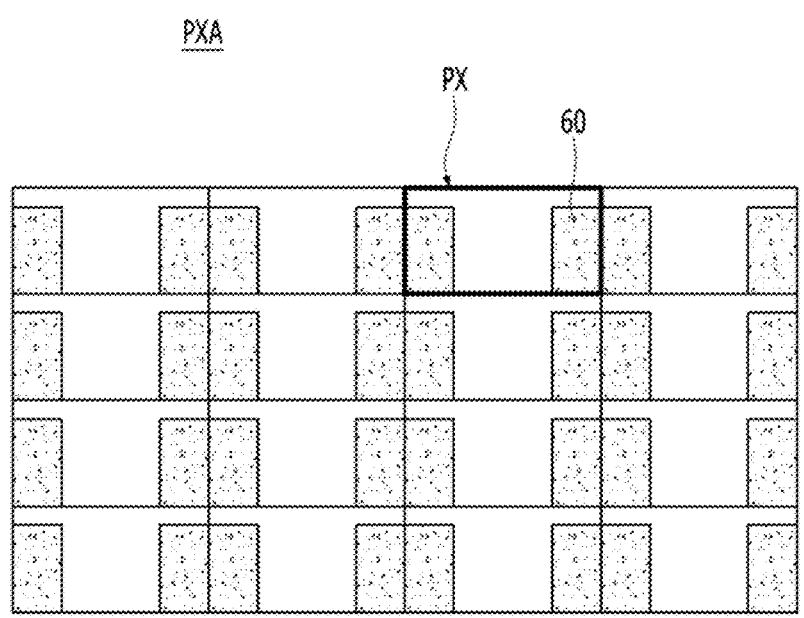
FIG. 5D is a bottom view of the lower shield in the image sensor in accordance with an exemplary embodiment of the inventive concepts.
Figure 5E:
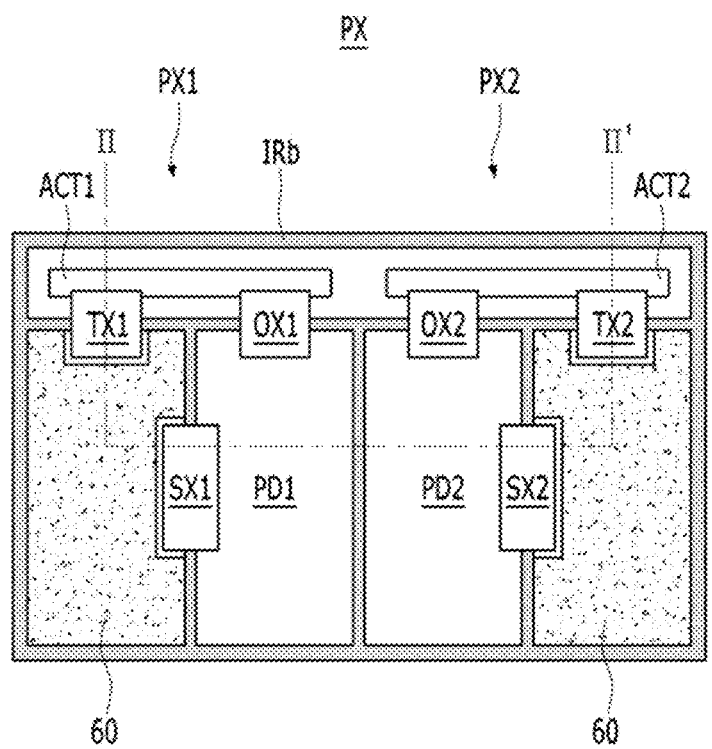
FIG. 5E is a top view illustrating the unit pixel overlapping with the bottom shield in the image sensor in accordance with an exemplary embodiment of the inventive concepts.
Figure 5F:
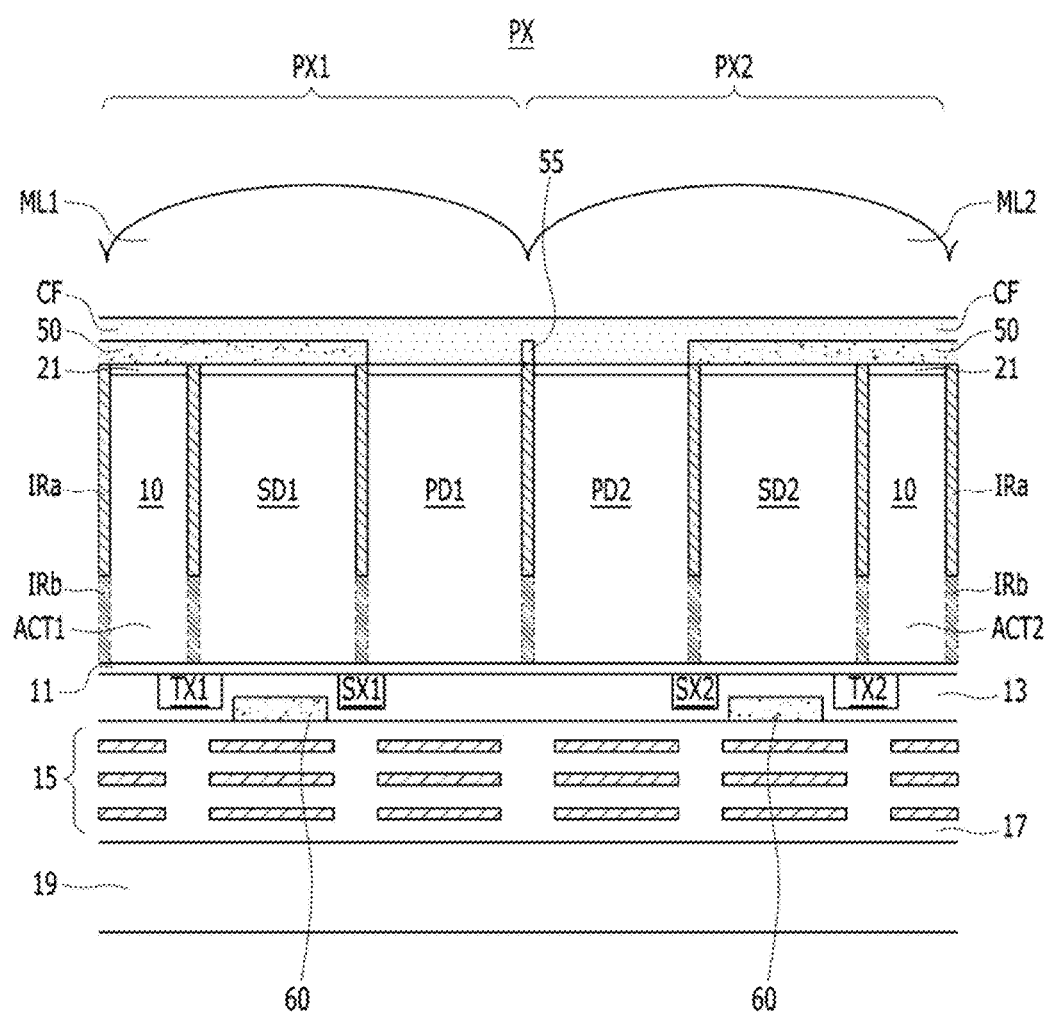
FIG. 5F is a longitudinal cross-sectional view of the image sensor taken along a line II-II' shown in FIG. 5E in accordance with an exemplary embodiment of the inventive concepts.

FIG. 5A Is a magnified top view of the unit pixel PX in the image sensor in accordance with an exemplary embodiment of the inventive concepts. FIG. 5B is a top view of the upper shield 50 of the unit pixel PX in the image sensor in accordance with an exemplary embodiment of the inventive concepts. FIG. 5C is a top view showing the unit pixel PX, the upper shield 50, and the micro lenses ML1 and ML2 that overlap one with another in the image sensor in accordance with an exemplary embodiment of the inventive concepts. FIG. 5D is a bottom view of the lower shield 60 in the image sensor in accordance with an exemplary embodiment of the inventive concepts. FIG. 5E is a top view illustrating the unit pixel PX overlapping with the bottom shield 60 in the image sensor in accordance with an exemplary embodiment of the inventive concepts. FIG. 5F is a longitudinal cross-sectional view of the image sensor taken along a line II-II' shown in FIG. 5E in accordance with an exemplary embodiment of the inventive concepts.

Referring to FIG. 5A, the unit pixel PX in the image sensor in accordance with the embodiment of the inventive concepts may include the first and second storage diodes SD1 and SD2 that are arrayed to be distant from each other and the first and second photodiodes PD1 and PD2 that are arrayed to be close to each other, in contrast to the unit pixel PX shown in FIG. 3B. Specifically, the unit pixel PX of FIG. 5A, may have the first storage diode SD1, the first photodiode PD1, the second photodiode PD2 and the second storage diode SD2 arranged in the recited order in a row direction.

Referring to FIGS. 5A to 5C, the upper shield 50 of the image sensor in accordance with the embodiment of the inventive concepts may be aligned and overlap with the first and second storage diodes SD1 and SD2 and the first and second active arrays ACT1 and ACT2 so as to leave physically open and optically exposed the first and second photodiodes PD1 and PD2.

Referring to FIGS. 5D and 5E, the lower shield 60 of the image sensor in accordance with the embodiment of the inventive concepts may be aligned and overlap with the first and second storage diodes SD1 and SD2 so as to physically and optically shield the first and second storage diodes SD1 and SD2. The first and second photodiodes PD1 and PD2 and the first and second active regions ACT1 and ACT2 may not overlap with the lower shield 60. In addition, the lower shield 60 may not overlap with the first and second storage transfer transistors SX1 and SX2 and the first and second transfer transistors TX1 and TX2 but leave them physically open them.

Referring to FIG. 5F, compared with the unit pixel PX of the image sensor Illustrated in FIG. 4, the unit pixel PX of the image sensor in accordance with an embodiment of the inventive concepts may include the first and second photodiodes PD1 and PD2 that are arrayed adjacent to each other, the first and second storage diodes SD1 and SD2 that are arrayed to be distant from each other, the upper shield 50 that is aligned and vertically overlap with the first and second storage diodes SD1 and SD2 and the first and second active regions ACT1 and ACT2, and the lower shield 60 that is aligned and vertically overlaps with the first and second storage diodes SD1 and SD2. In addition, the unit pixel PX of the image sensor may further include a grid pattern 55 over the upper isolation region IRa between the first photodiode PD1 and the second photodiode PD2. The grid pattern 55 may define openings that are aligned with the first and second photodiodes PD1 and PD2 from the perspective from a top view. In other words, the grid pattern 55 may be part of the upper shield 50.

Figure 6A:
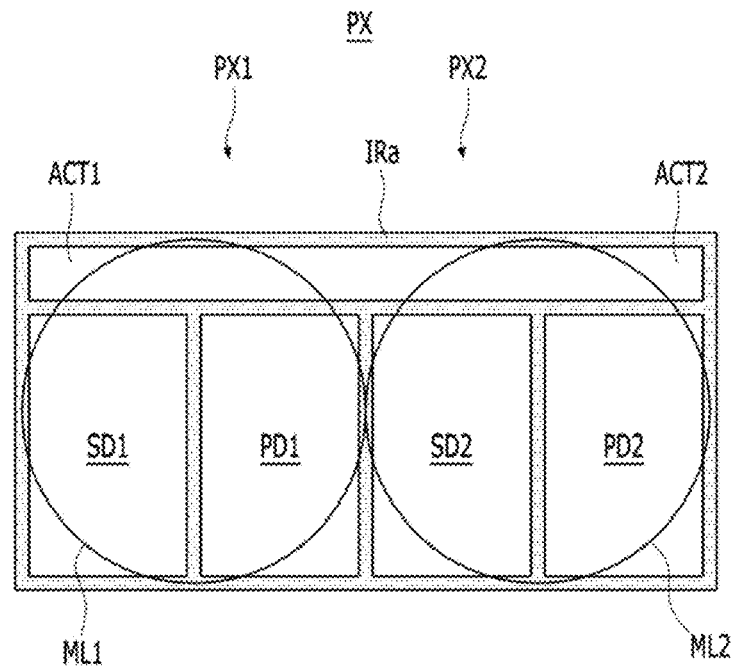
FIGS. 6A and 6B are magnified top views showing unit pixels of the image sensors in accordance with exemplary embodiments of the inventive concepts.
Figure 6B:
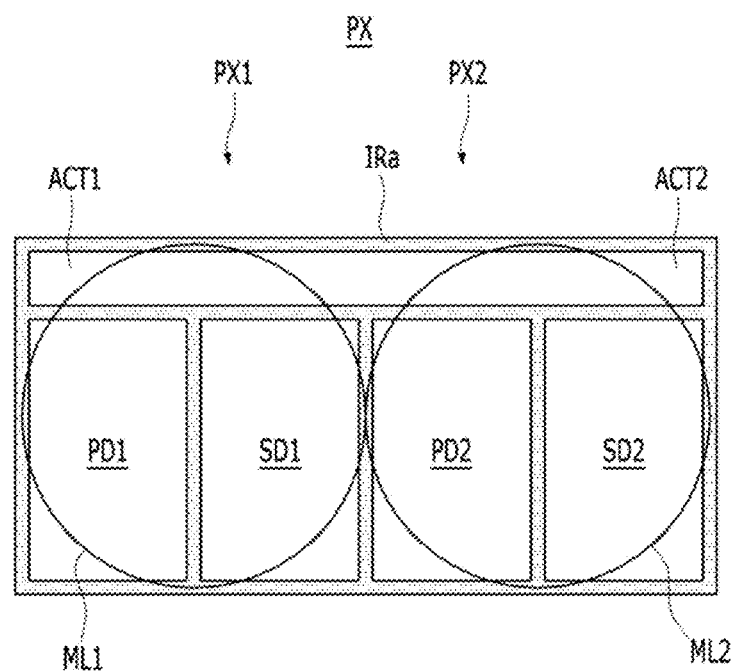

FIGS. 6A and 6B are magnified top views showing unit pixels of the image sensors in accordance with other exemplary embodiments of the inventive concepts. Referring to FIGS. 6A and 6B, the unit pixels of the image sensors in accordance with the embodiments of the inventive concepts may include the first sub-pixel PX1 and the second sub-pixel PX2 each of which includes the first and second photodiodes PD1 and PD2, the first and second storage diodes SD1 and SD2, and the first and second active arrays ACT1 and ACT2. For example, according to the embodiment of FIG. 6A, the unit pixel PX may include the first storage diode SD1, the first photodiode PD1, the second storage diode SD2 and the second photodiode PD2 arranged in the recited order in a row. Or according to FIG. 6B, the unit pixel PX may include the first photodiode PD1, the first storage diode SD1, the second photodiode PD2, and the second storage diode SD2 in the recited order in the row direction.

Figure 6C:
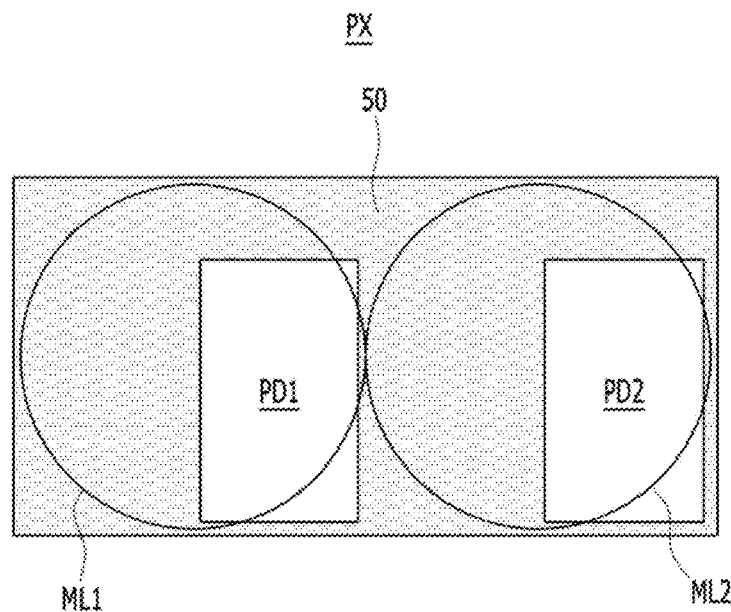
FIGS. 6C and 6D are magnified top views showing upper shields of the image sensors in accordance with exemplary embodiments of the inventive concepts.
Figure 6D:
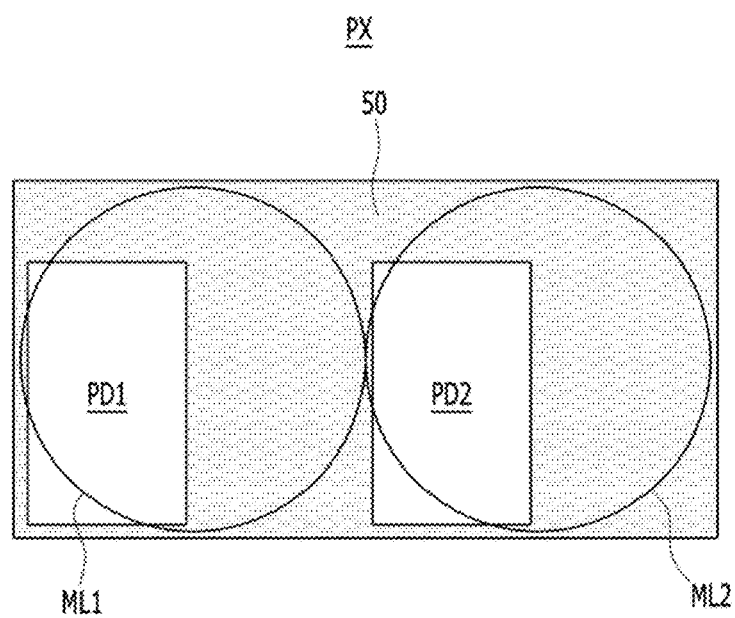

FIGS. 6C and 6D are magnified top views showing the upper shields 50 of the image sensors in accordance with exemplary embodiments of the inventive concepts. Referring to FIGS. 6C and 6D, the upper shields 50 of the image sensors in accordance with the embodiments of the inventive concepts may optically expose the first and second photodiodes PD1 and PD2, and optically shield the first and second storage diodes SD1 and SD2 and the first and second active arrays ACT1 and ACT2.

Figure 6E:
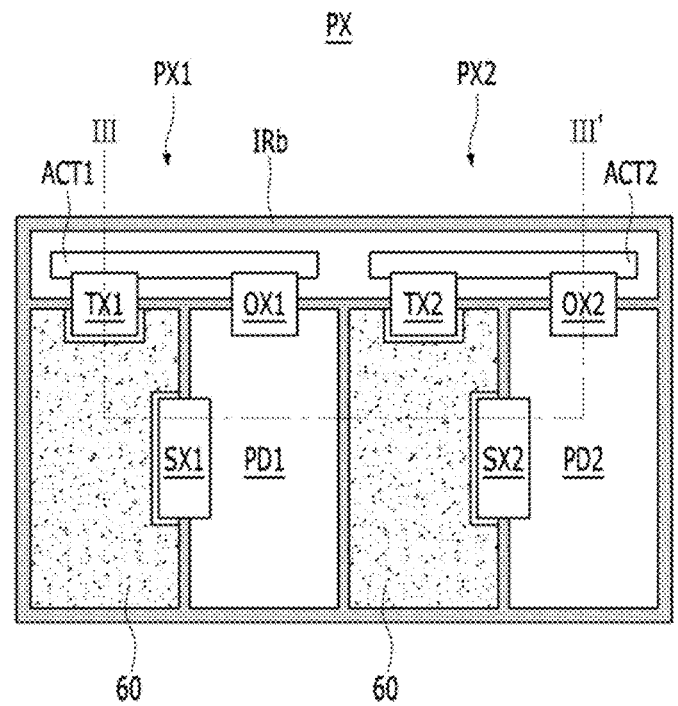
FIGS. 6E and 6F are magnified bottom views showing bottom shields overlapping with the unit pixels in the image sensors in accordance with exemplary embodiments of the inventive concepts.
Figure 6F:
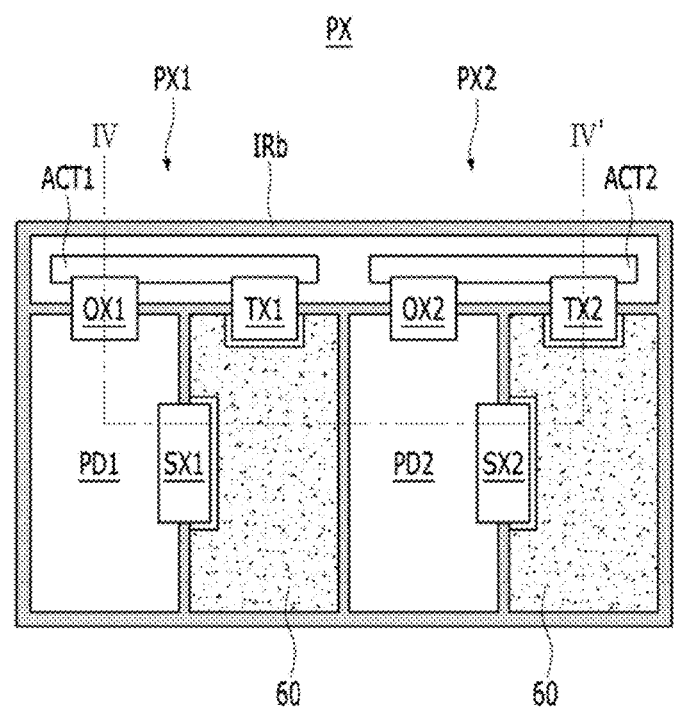

FIGS. 6E and 6F are magnified bottom views showing the bottom shields 60 overlapping with the unit pixels PX in the image sensors in accordance with exemplary embodiments of the inventive concepts. Referring to FIGS. 6E and 6F, the bottom shields 60 of the image sensors in accordance with the embodiments of the inventive concepts may be aligned and overlap with the first and second storage diodes SD1 and SD2, and may not overlap with the first and second photodiodes PD1 and PD2 and the first and second active regions ACT1 and ACT2.

Figure 6G:
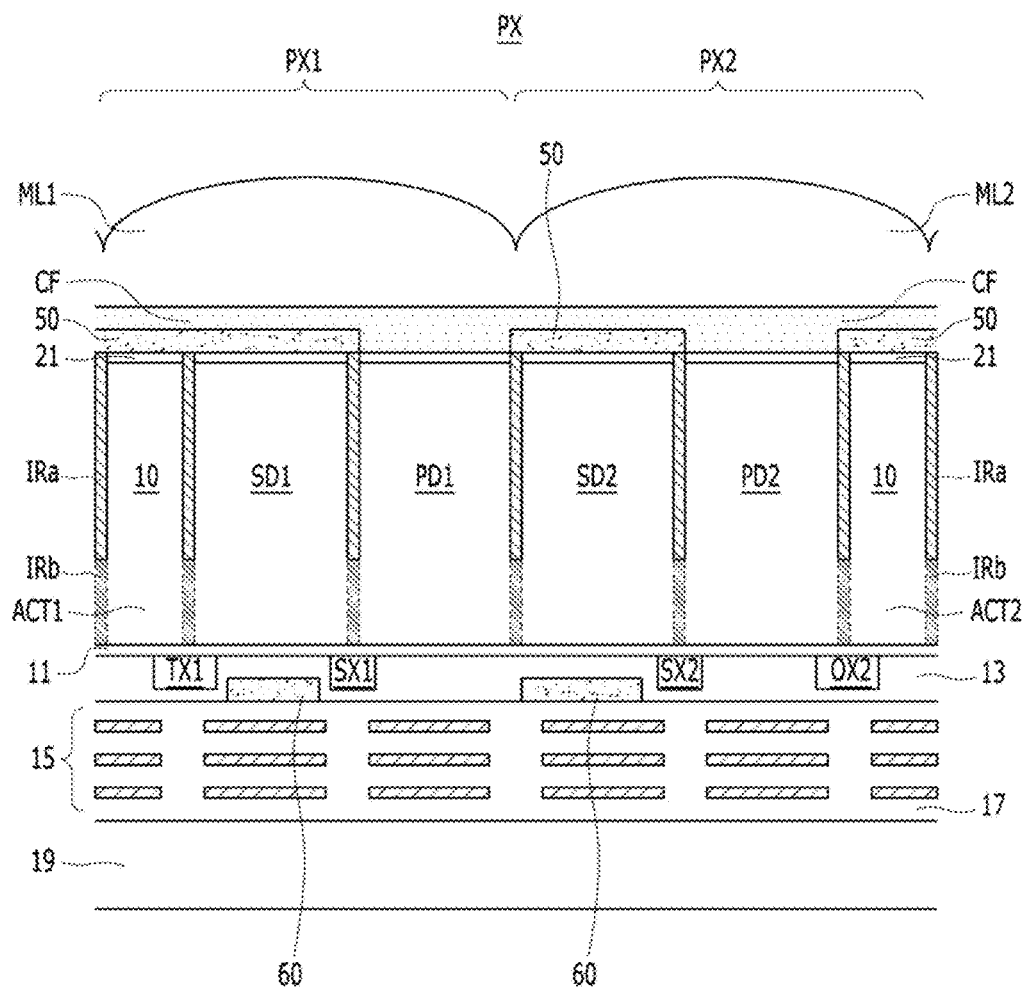
FIGS. 6G and 6H are longitudinal cross-sectional views of the image sensors taken along a line III-III' shown in FIG. 6E and a line IV-IV' shown in FIG. 6F, respectively.
Figure 6H:
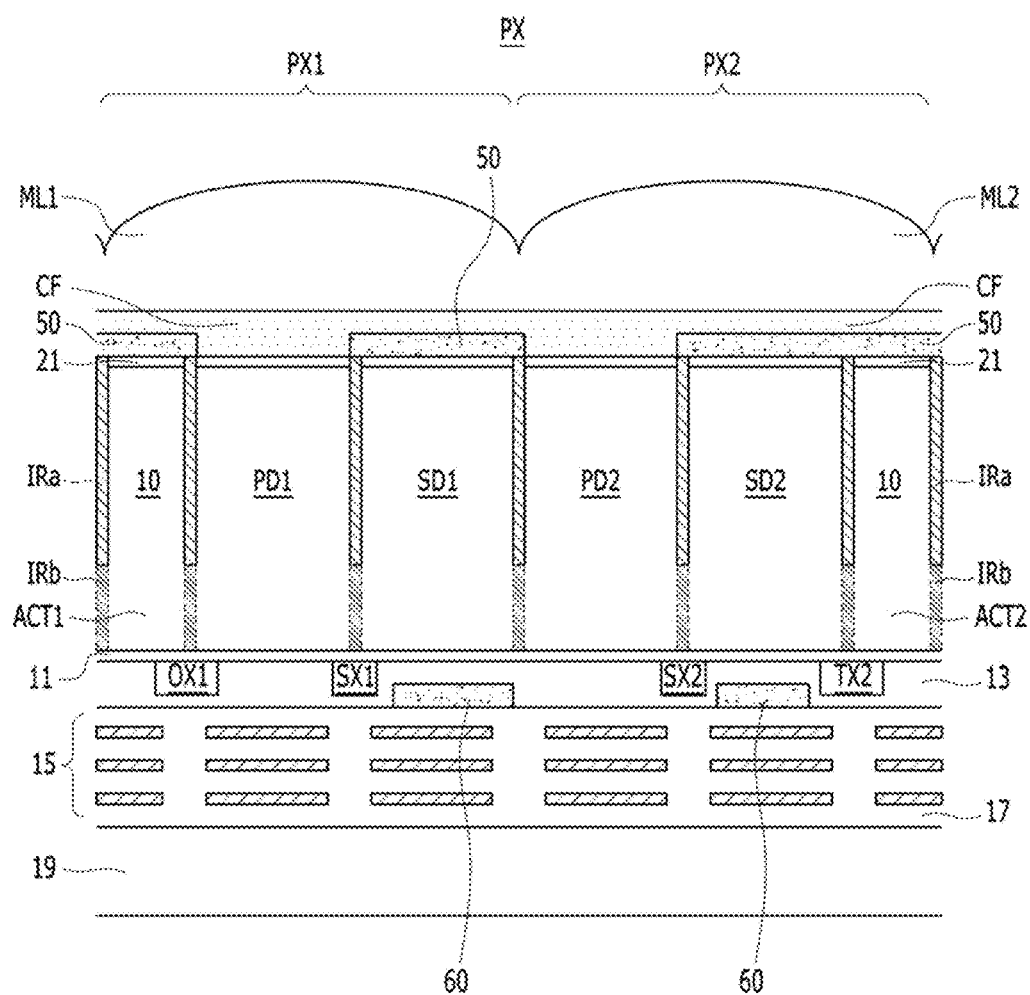

FIGS. 6G and 6H are longitudinal cross-sectional views of the image sensors taken along a line III-III' shown in FIG. 6E and a line IV-IV' shown in FIG. 6F, respectively. Referring to FIGS. 6G and 6H, the unit pixels PX of the image sensors in accordance with the embodiments of the inventive concepts may include the upper shields 50 and the lower shields 60 that may vertically overlap with the first and second storage diodes SD1 and SD2.

Figure 7A:
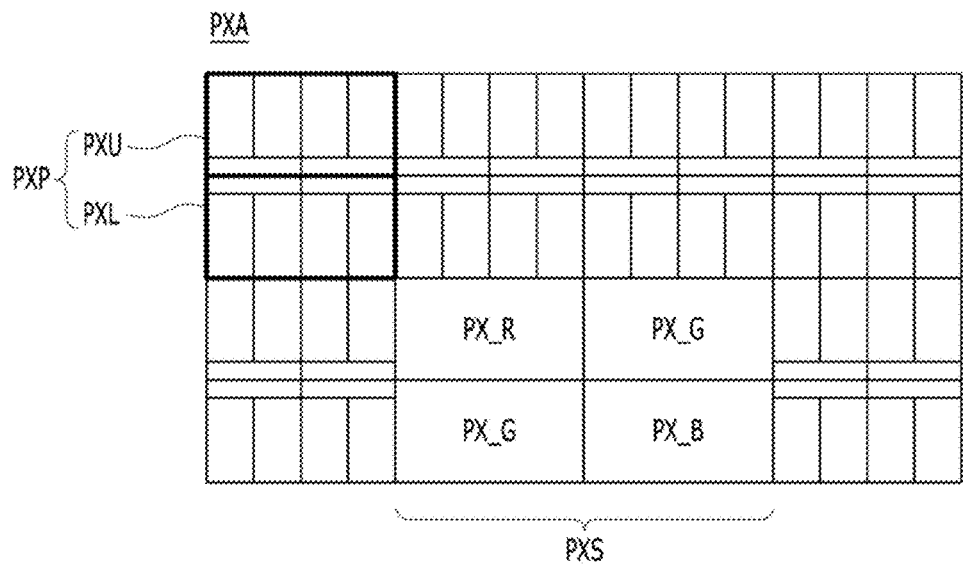
FIG. 7A is a conceptual layout of an upper surface or a conceptual top view of a pixel array of an image sensor in accordance with an exemplary embodiment of the inventive concepts.

FIG. 7A is a conceptual layout of an upper surface or a conceptual top view of a pixel array PXA of an image sensor in accordance with an exemplary embodiment of the inventive concepts. Referring to FIG. 7A, the pixel array PXA of an image sensor in accordance with an embodiment of the inventive concepts may include a plurality of pixel sets PXS that are arrayed in the form of matrix, and each of the pixel sets PXS may include four unit pixels PX_R, PX_G and PX_B that are arrayed in a form of 4 bays, a form of a checker board, or a 4-window form. The unit pixels PX_R, PX_G and PX_B of one pixel set PXS may include two pairs of unit pixels PXU and PXL that are arrayed to confront each other in the up and down direction. The confronting unit pixels PXU and PXL may be arrayed in an up and down mirroring form, for example, in an up and down linear symmetric form. The active arrays of the unit pixels PXU and PXL may be integrated. In other words, the image sensor in accordance with the embodiment of the inventive concepts may have a shared pixel structure.

Figure 7B:
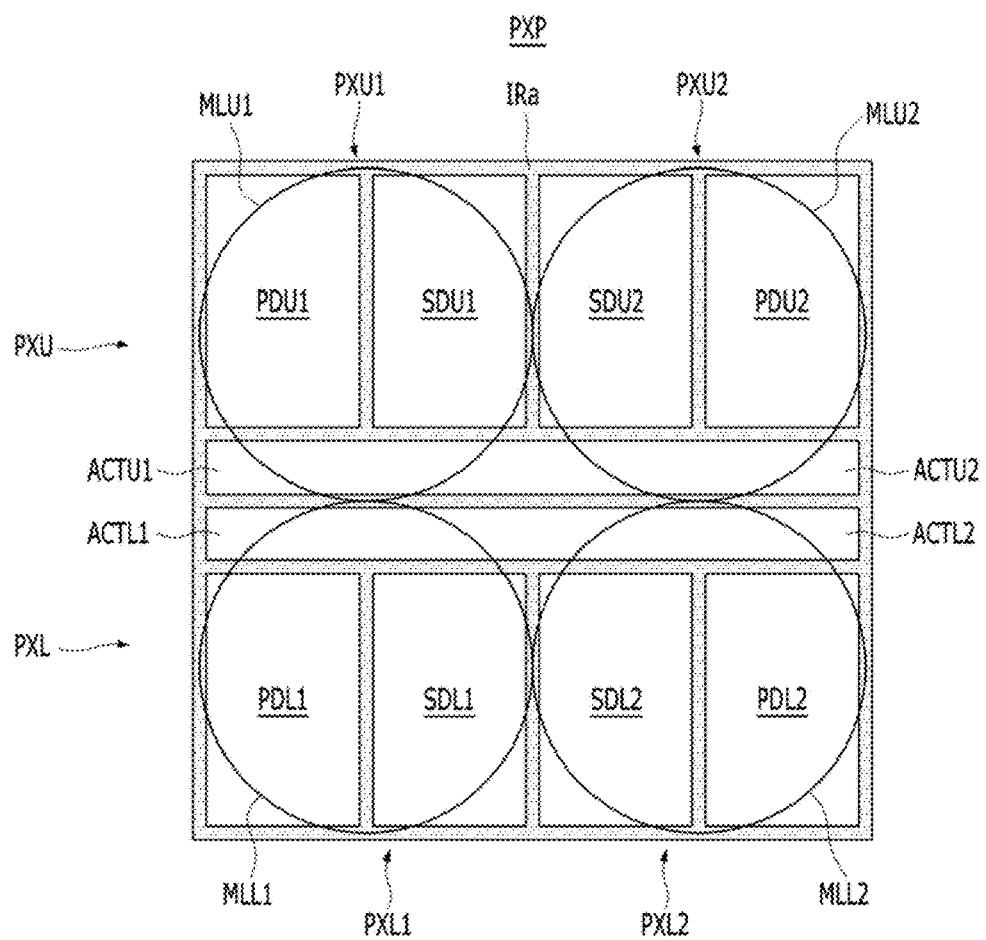
FIG. 7B is a magnified layout or a magnified top view illustrating a unit pixel pair of the image sensor shown in FIG. 7A In accordance with an exemplary embodiment of the inventive concepts.

FIG. 7B is a magnified layout or a magnified top view illustrating a unit pixel pair PXP of the image sensor shown in FIG. 7A in accordance with an exemplary embodiment of the inventive concepts. Referring to FIG. 7B, the unit pixel pair PXP of the image sensor may include an upper unit pixel PXU and a lower unit pixel PXL that are arrayed in an up and down mirroring form, for example, in an up and down linear symmetric form. The upper unit pixel PXU may include a first upper sub pixel PXU1 and a second upper sub pixel PXU2, and the lower unit pixel PXL may include a first lower sub pixel PXL1 and a second lower sub pixel PXL2.

The sub pixels PXU1, PXU2, PXL1 and PXL2 may be independently aligned and overlap with circular micro lenses MLU1, MLU2, MLL1 and MLL2, respectively.

The first upper sub pixel PXU1 and the second upper sub pixel PXU2 may be arrayed in a right and left mirroring form, for example, in a right and left linear symmetric form. For example, a first upper photodiode PDU1 of the first upper sub pixel PXU1 and a second upper photodiode PDU2 of the second upper sub pixel PXU2 may be disposed to be distant from each other, and a first upper storage diode SDU1 of the first upper sub pixel PXU1 and a second upper storage diode SDU2 of the second upper sub pixel PXU2 may be disposed adjacent to each other. For example, the upper unit pixel PXU may have an arrangement of the first upper photodiode PDU1-the first upper storage diode SDU1-the second upper storage diode SDU2-second upper photodiode PDU2 in the row direction.

According to an embodiment of the Inventive concepts, the first upper photodiode PDU1 of the first upper sub pixel PXU1 and the second upper photodiode PDU2 of the second upper sub pixel PXU2 may be disposed adjacent to each other, and the first upper storage diode SDU1 of the first upper sub pixel PXU1 and the second upper storage diode SDU2 of the second upper sub pixel PXU2 may be disposed to be distant from each other. The first upper sub pixel PXU1 and the second upper sub pixel PXU2 may be arrayed in a right and left mirroring form, for example, in a right and left linear symmetric form. For example, the upper unit pixel PXU may have an arrangement wherein the first upper storage diode SDU1, the first upper photodiode PDU1, the second upper photodiode PDU2, and the second upper storage diode SDU2 are arranged in the recited order in the row direction.

Likewise, the first lower sub pixel PXL1 and the second lower sub pixel PXL2 may be arrayed in a right and left mirroring form, for example, in a right and left linear symmetric form. For example, a first lower photodiode PDL1 of the first lower sub pixel PXL1 and the second lower photodiode PDL2 of the second lower sub pixel PXL2 may be disposed to be distant from each other, and the first lower storage diode SDL1 of the first lower sub pixel PXL1 and the second lower storage diode SDL2 of the second lower sub pixel PXL2 may be disposed adjacent to each other. For example, the lower unit pixel PXL may have an arrangement of the first lower photodiode PDL1-the first lower storage diode SDL1-the second lower storage diode SDL2-the second lower photodiode PDL2 in the row direction.

According to an embodiment of the inventive concepts, the first lower photodiode PDL1 of the first lower sub pixel PXL1 and the second lower photodiode PDL2 of the second lower sub pixel PXL2 may be disposed adjacent to each other, and the first lower storage diode SDL1 of the first lower sub pixel PXL1 and the second lower storage diode SDL2 of the second lower sub pixel PXL2 may be disposed to be distant from each other. The first lower sub pixel PXL1 and the second lower sub pixel PXL2 may be arrayed in a right and left mirroring form, for example, in a right and left linear symmetric form. For example, the upper unit pixel PXU may have an arrangement wherein the first lower storage diode SDL1, the first lower photodiode PDL1, the second lower photodiode PDL2, and the second lower storage diode SDL2 are arranged in the recited order in the row direction.

Figure 8A:
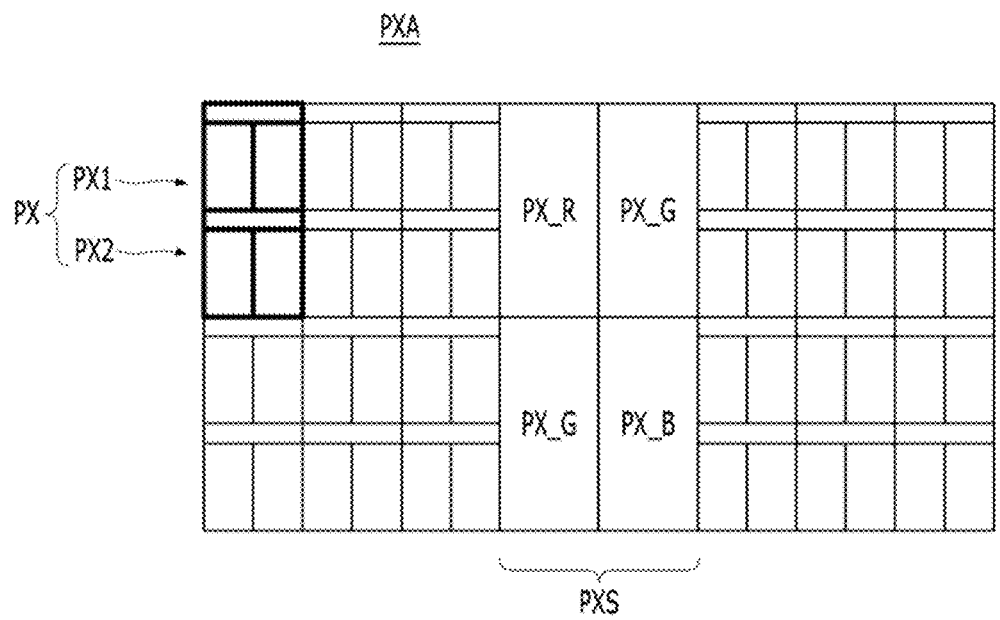
FIG. 8A is a conceptual layout of an upper surface or a conceptual top view of a pixel array of the image sensor in accordance with an exemplary embodiment of the inventive concepts.
Figure 8B:
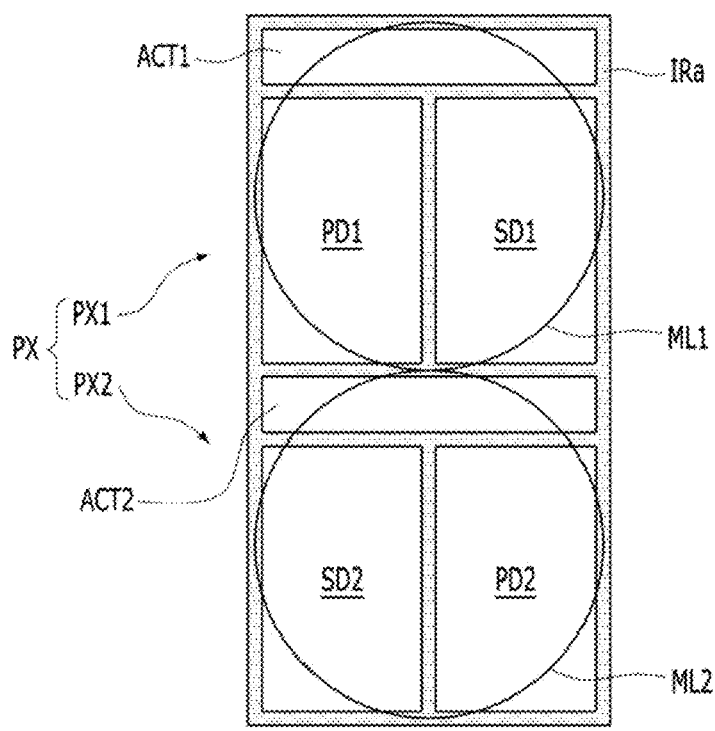
FIGS. 8B and 8C are magnified top views illustrating unit pixels of the image sensors in accordance with exemplary embodiments of the inventive concepts.
Figure 8C:
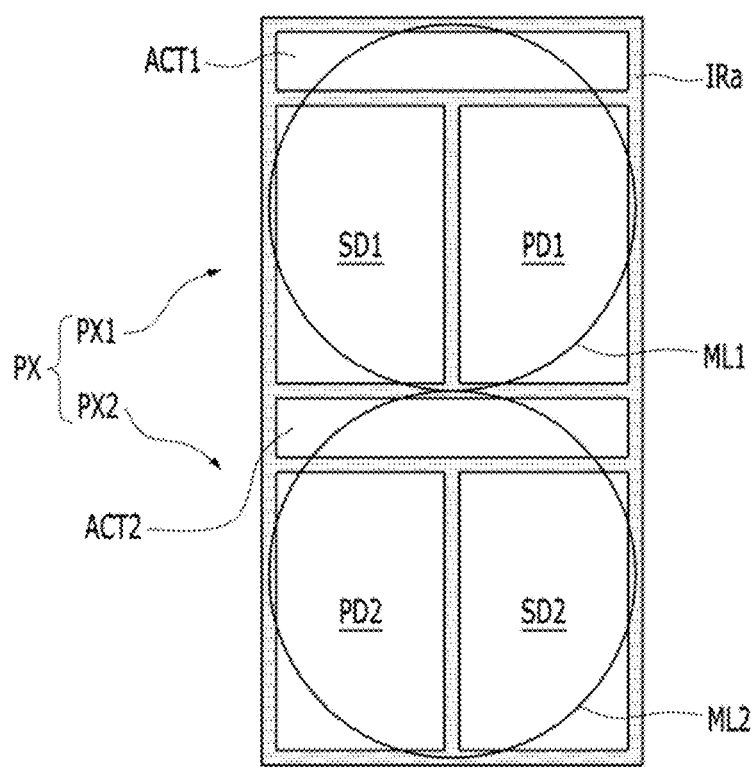

FIG. 8A is a conceptual layout of an upper surface or a conceptual top view of the pixel array PXA of the image sensor in accordance with an exemplary embodiment of the inventive concepts. FIGS. 8B and 8C are magnified top views illustrating the unit pixels PX of the image sensors in accordance with exemplary embodiments of the inventive concepts.

Referring to FIGS. 8A to 8C, the pixel array PXA of the image sensor in accordance with the embodiment of the inventive concepts may include a plurality of pixel sets PXS that are arrayed in the form of matrix, and each of the pixel sets PXS may include four unit pixels PX that are arrayed in a form of 4 bays, a form of a checker board, or a 4-window form. Each of the unit pixels PX may include a first sub pixel PX1 and a second sub pixel PX2 that are stacked up and down. The first sub pixel PX1 disposed in the upper portion and the second sub pixel PX2 disposed in the lower portion may include the first and second photodiodes PD1 and PD2 that are arrayed in a first diagonal direction and the first and second storage diodes SD1 and SD2 that are arrayed in a second diagonal direction. The first diagonal direction and the second diagonal direction may be orthogonal to each other. In this embodiment of the inventive concepts, the positions of the first photodiode PD1 and the first storage diode SD1 may be switched. Also, the positions of the second photodiode PD2 and the second storage diode SD2 may be switched.

Figure 9A:
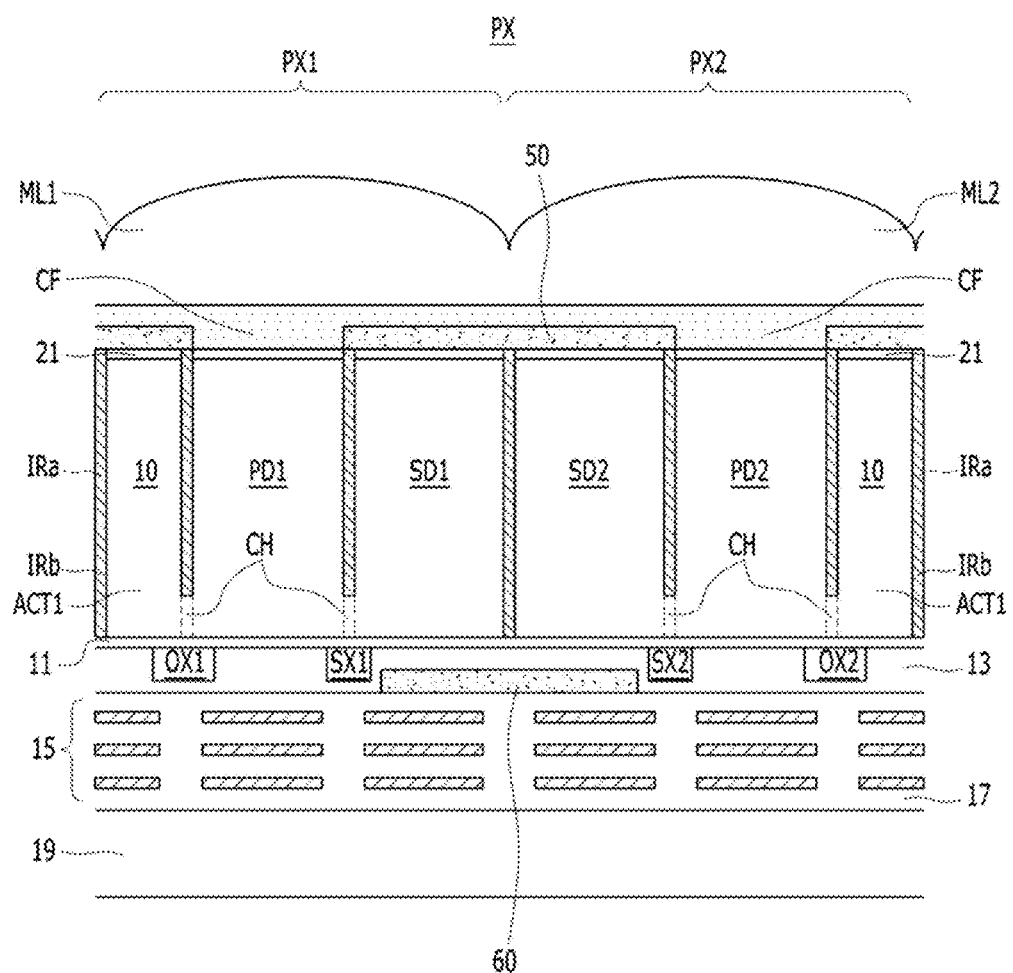
FIGS. 9A and 9B are conceptual longitudinal cross-sectional views illustrating the unit pixels of the image sensor in accordance with an exemplary embodiment of the inventive concepts.
Figure 9B:
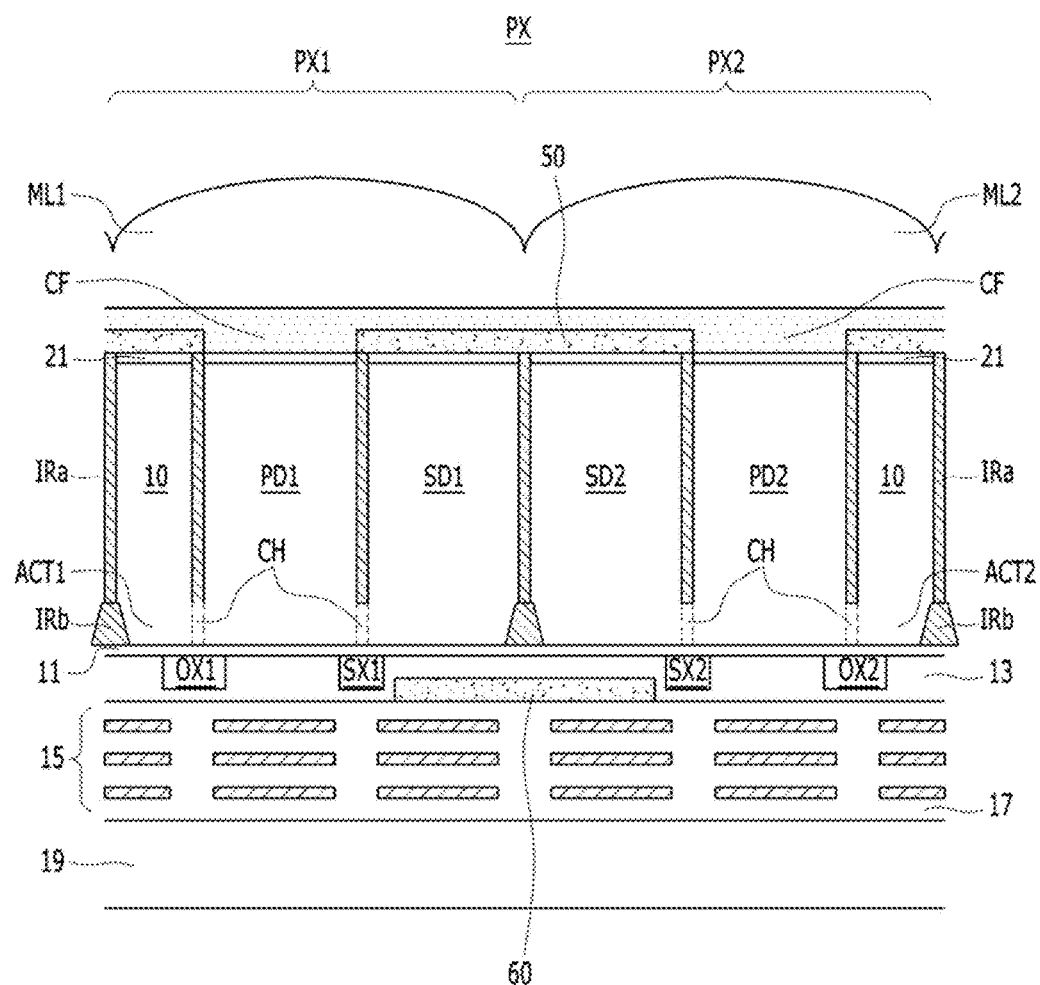

FIGS. 9A and 9B are conceptual longitudinal cross-sectional views illustrating the unit pixels PX of the image sensors in accordance with exemplary embodiments of the inventive concepts. The longitudinal cross-sectional views are obtained by cutting the image sensor of FIG. 3G along a line I-I'.

Referring to FIG. 9A, the unit pixels PX of the image sensors in accordance with the embodiments of the inventive concepts may exclude the lower isolation regions IRb overlapping with the transistors OX1, OX2, SX1 and SX2, compared with the unit pixel PX of the image sensor illustrated in FIG. 4. In other words, channel regions CH may be formed in the inside of a portion of the substrate adjacent to the transistors OX1, OX2, SX1 and SX2. Although not illustrated, the channel regions CH may be formed in the inside of a portion of the substrate 10 adjacent to the first and second transfer transistors TX1 and TX2. The channel regions CH may include P-type ions. According to the embodiment of the inventive concepts, the lower isolation region IRb may include a dielectric material or silicon filling trenches that are formed from the lower surface of the substrate 10. According to an embodiment of the Inventive concepts, the channel regions CH may include silicon filling trenches that are formed from the lower surface of the substrate 10 to the inside of the substrate 10.

Referring to FIG. 9B, the unit pixel PX of the image sensor in accordance with the embodiment of the inventive concepts may include the lower isolation region IRb of a Shallow Trench Isolation (STI) type, compared with the unit pixel PX of the image sensor illustrated in FIG. 4. For example, the lower isolation region IRb may include a dielectric material or silicon that fills shallow trenches which are formed from the lower surface of the substrate 10 to the inside of the substrate 10. The channel regions CH may be formed in a portion of the substrate 10 adjacent to the transistors OX1, OX2, TX1, TX2, SX1 and SX2.

The unit pixels PX of the image sensors in accordance with the various embodiments of the inventive concepts may be arrayed in a horizontal direction, a vertical direction, or a diagonal direction in the pixel array PXA.

The unit pixels PX of the image sensors in accordance with the various embodiments of the inventive concepts may be arrayed all over the pixel array PXA or locally in the pixel array PXA.

FIGS. 10A to 10K are longitudinal cross-sectional views illustrating a method for fabricating an image sensor in accordance with an exemplary embodiment of the inventive concepts. In this embodiment of the inventive concepts, a method for fabricating the unit pixel PX of the image sensor illustrated in FIG. 4 is exemplarily described.

Figure 10A:
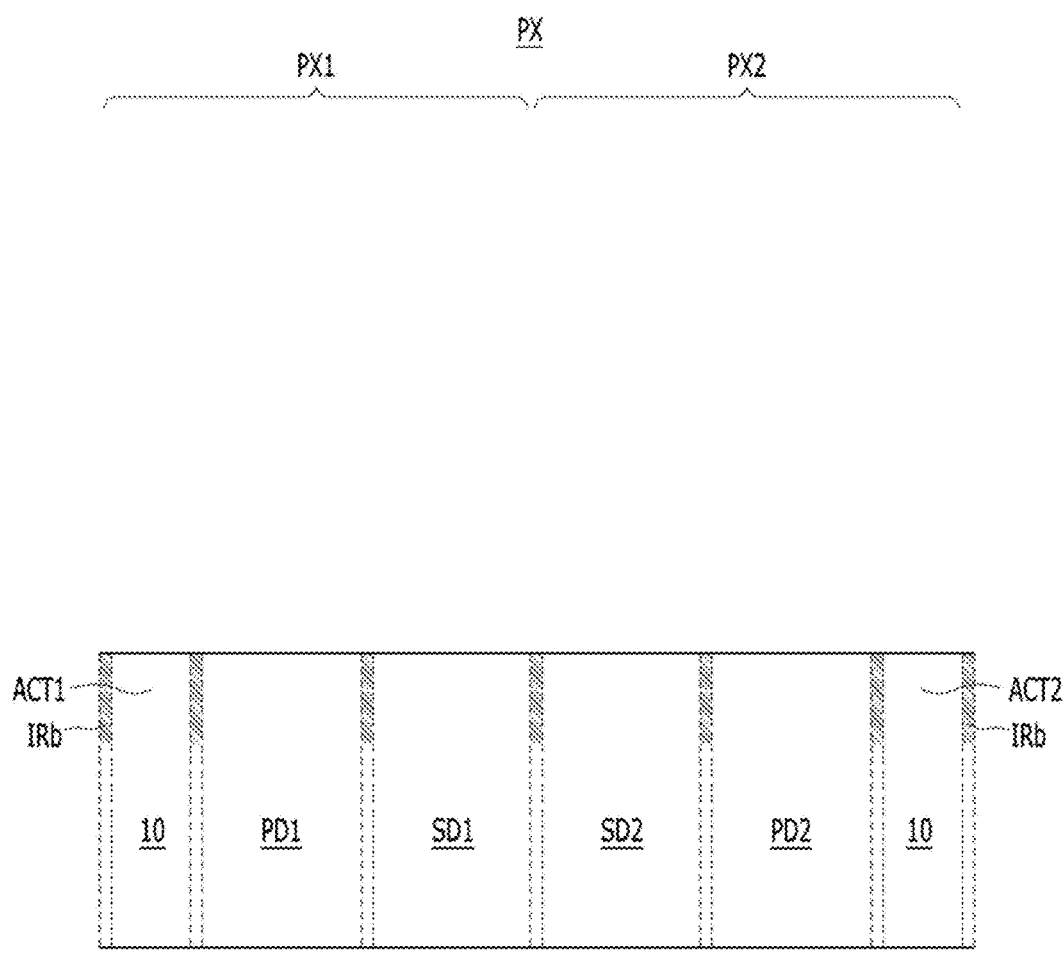

Referring to FIG. 10A, the method for fabricating the image sensor in accordance with the embodiment of the inventive concepts may include preparing a substrate 10 and forming first and second photodiodes PD1 and PD2, first and second storage diodes SD1 and SD2, and first and second active regions ACT1 and ACT2 in the substrate 10.

The substrate 10 may include a monocrystalline silicon wafer or an epitaxially grown monocrystalline silicon layer.

The first and second photodiodes PD1 and PD2, the first and second storage diodes SD1 and SD2, and the first and second active regions ACT1 and ACT2 may be formed through an ion implantation process. The ion implantation process may include an N-type ion implantation process for implanting N-type ions, such as phosphorous (P) or arsenic (As), and a P-type ion implantation process for implanting P-type ions, such as boron (B). The P-type ions implanted between the diodes PD1, PD2, SD1 and SD2 may form a lower isolation region IRb.

Figure 10B:
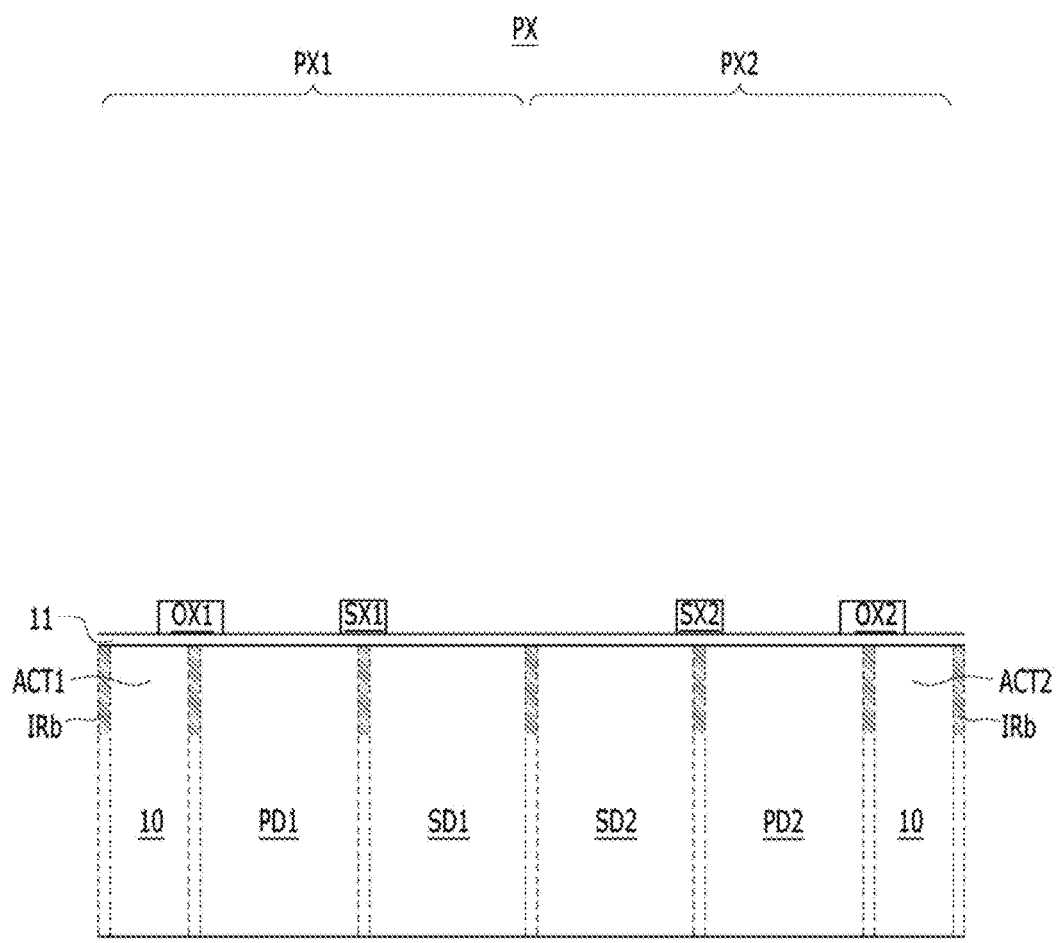

Referring to FIG. 10B, the method for fabricating the image sensor in accordance with the embodiment of the inventive concepts may include forming a lower dielectric layer 11 on a surface of the substrate 10 and forming transistors OX1, OX2, SX1 and SX2. The lower dielectric layer 11 may include a silicon oxide or a metal oxide that is formed by performing an oxidation process or a deposition process. The transistors OX1, OX2, SX1 and SX2 may include first and second over-flow transistors OX1 and OX2 that are formed over the interface between the first and second photodiodes PD1 and PD2 and the first and second active regions ACT1 and ACT2, first and second storage transfer transistors SX1 and SX2 that are formed over the interface between the first and second photodiodes PD1 and PD2 and the first and second storage diodes SD1 and SD2, and first and second transfer transistors (not shown) that are formed over the Interface between the first and second storage transfer transistors SX1 and SX2 and the first and second active regions ACT1 and ACT2.

Figure 10C:
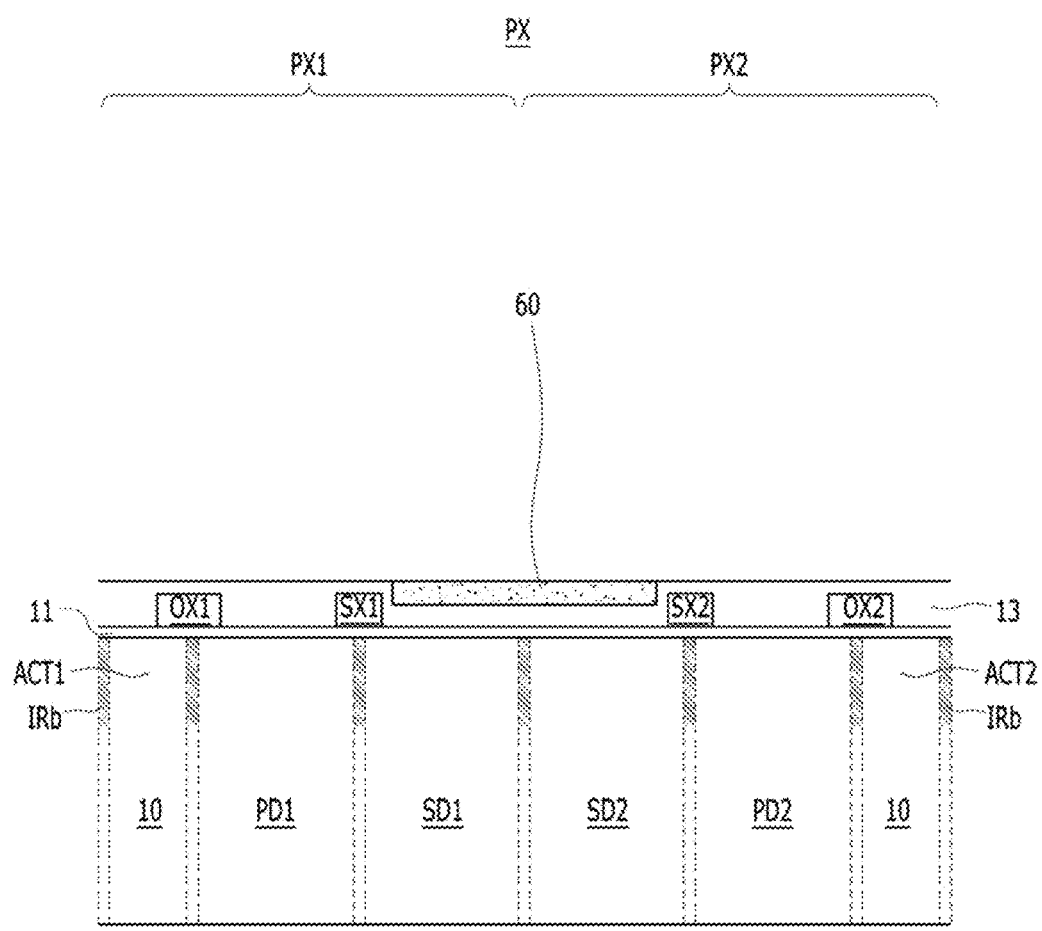

Referring to FIG. 10C, the method for fabricating the image sensor in accordance with the embodiment of the inventive concepts may include forming a lower inter-layer dielectric layer 13 and a lower shield 60. The lower inter-layer dielectric layer 13 may be formed by performing a deposition process and forming a silicon oxide that covers the lower dielectric layer 11 and the transistors OX1, OX2, SX1 and SX2. The lower shield 60 may be formed by performing a deposition process on the inside or upper portion of the lower inter-layer dielectric layer 13 and performing a planarization process or an etch process. For example, the lower shield 60 may be formed by forming trenches over the lower inter-layer dielectric layer 13, filling the inside of the trenches with a shielding material such as a metal, and performing a planarization process such as Chemical Mechanical Polishing (CMP) process. According to an embodiment of the inventive concepts, the lower shield 60 may be formed by forming a shielding material all over the lower inter-layer dielectric layer 13 and then performing an etch process. The lower shield 60 may include an optically opaque material, such as a metal.

Figure 10D:
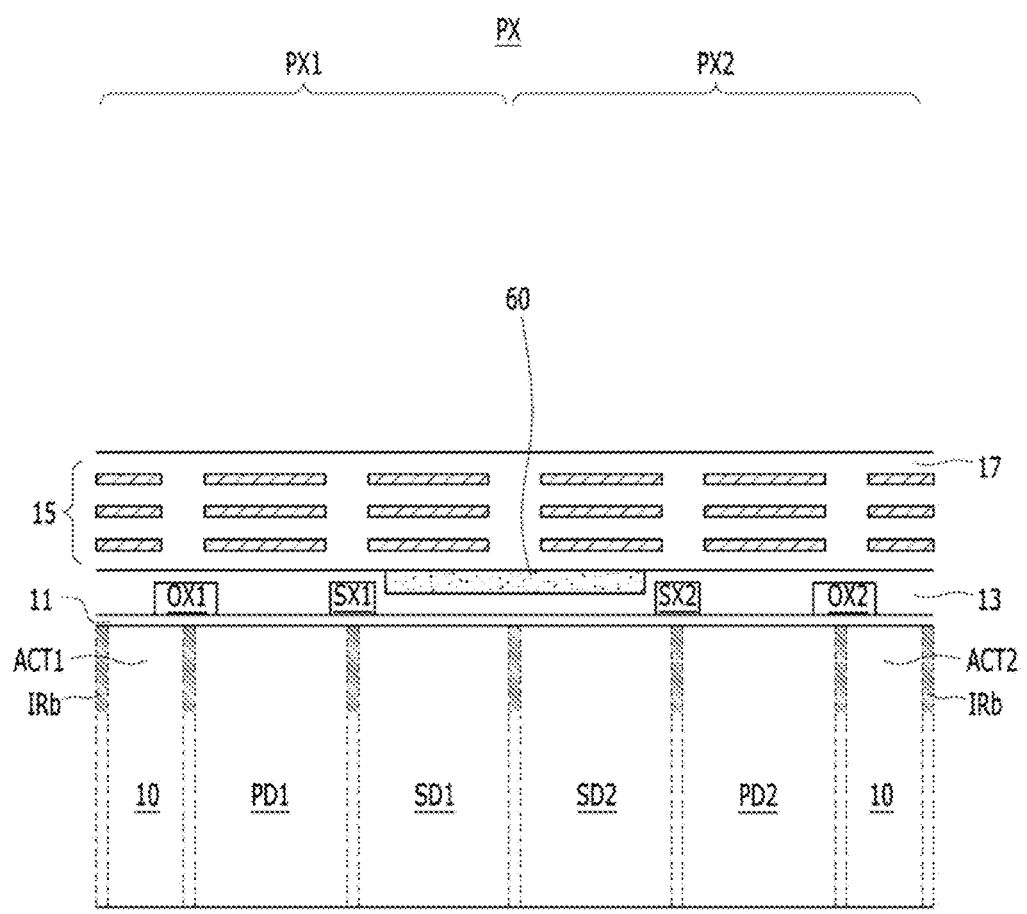

Referring to FIG. 10D, the method for fabricating the image sensor in accordance with the embodiment of the inventive concepts may include forming multiple layers of metal lines 15 and an upper inter-layer dielectric layer 17 over the lower inter-layer dielectric layer 13. The multiple layers of metal lines 15 may include a metal pattern that is formed by performing a patterning process or a planarization process. The upper inter-layer dielectric layer 17 may include a dielectric material such as a silicon oxide that is formed through a deposition process. The upper inter-layer dielectric layer 17 may include multiple layers of dielectric layers that correspond to the multiple layers of metal lines 15.

Figure 10E:
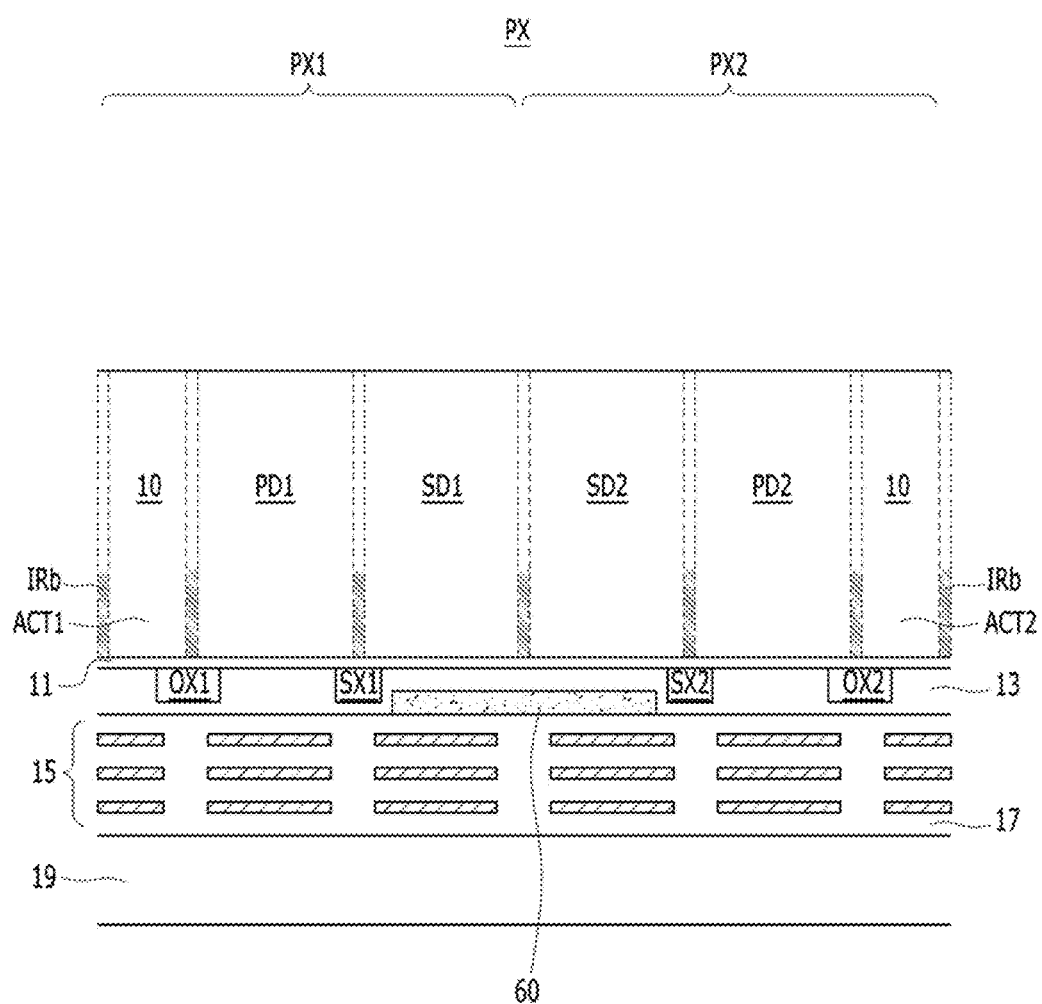

Referring to FIG. 10E, the method for fabricating the image sensor in accordance with the embodiment of the inventive concepts may include turning the substrate 10 upside down and mounting the substrate 10, which is turned over, on a lower device 19. The lower device 19 may include logic circuits capable of processing electrical signals, such as an image processor or a correlated double sampler (CDS). According to an embodiment of the inventive concepts, the lower device 19 may be a wafer carrier. Also, according to an embodiment of the inventive concepts, the method may further include recessing the upper surface of the substrate 10 by grinding or etching the upper surface of the substrate 10.

Figure 10F:
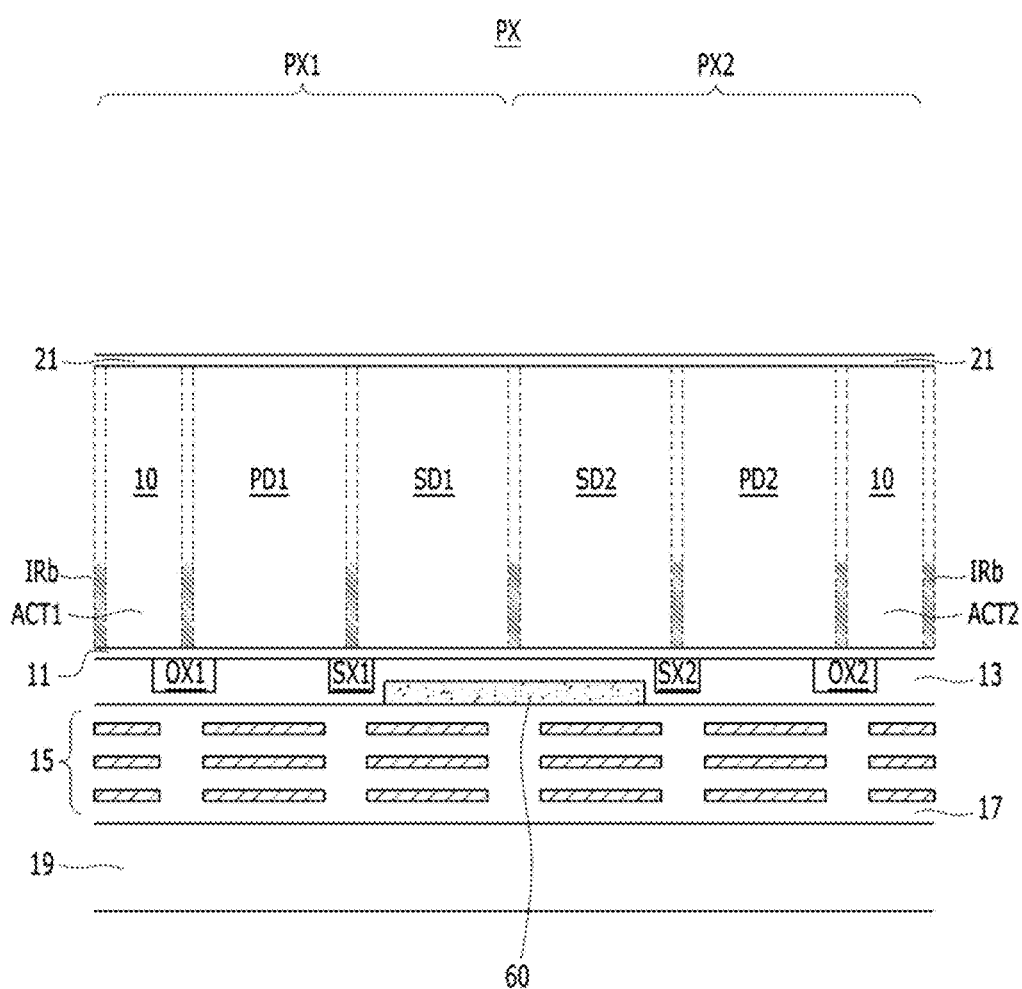

Referring to FIG. 10F, the method for fabricating the image sensor in accordance with the embodiment of the inventive concepts may include forming an upper dielectric layer 21 over the upper surface of the substrate 10 by performing a deposition process. The upper dielectric layer 21 may include one or more selected from the group consisting of a silicon oxide layer, a silicon nitride layer, a silicon oxynitride layer, another dielectric layer, and combinations thereof.

Figure 10G:
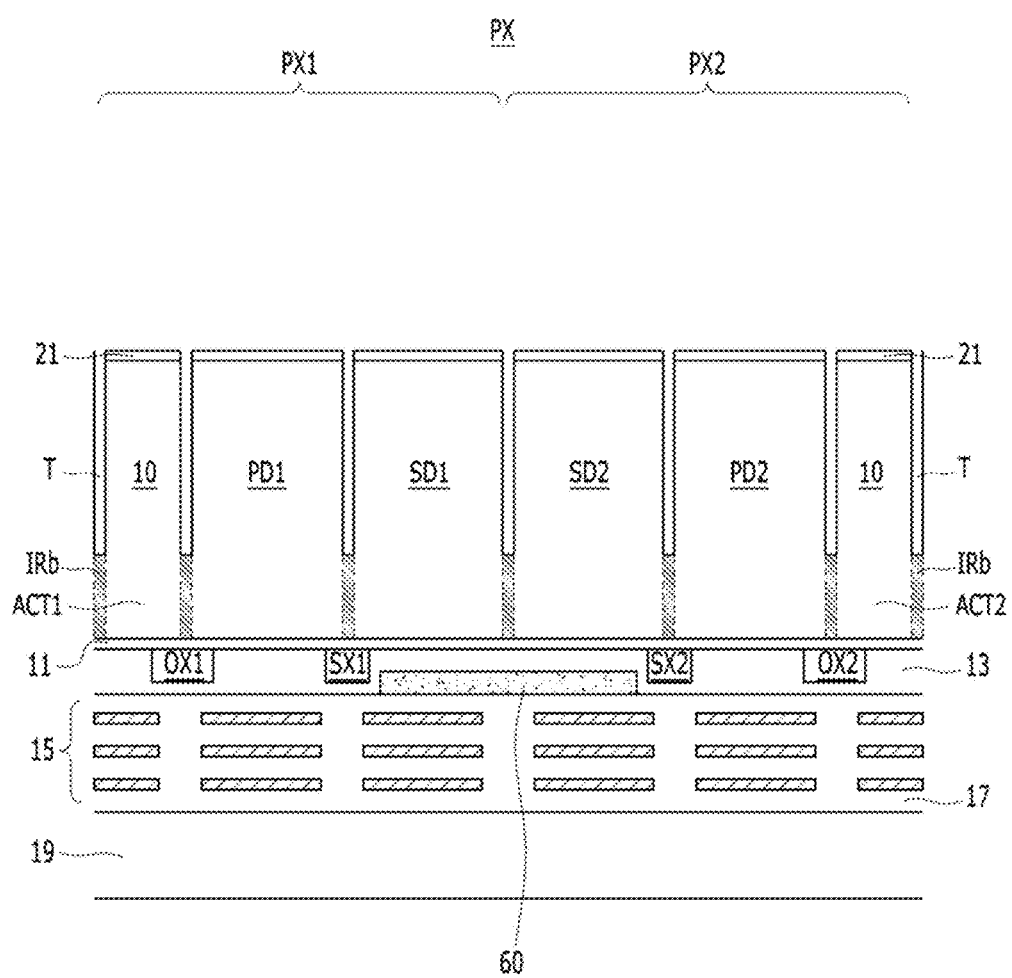

Referring to FIG. 10G, the method for fabricating the image sensor in accordance with the embodiment of the inventive concepts may include forming trenches T between the diodes PD1, PD2, SD1 and SD2 by performing a trench forming process. The trenches T may penetrate through the upper dielectric layer 21 and the substrate 10 to be vertically aligned with the lower isolation region IRb.

Figure 10H:
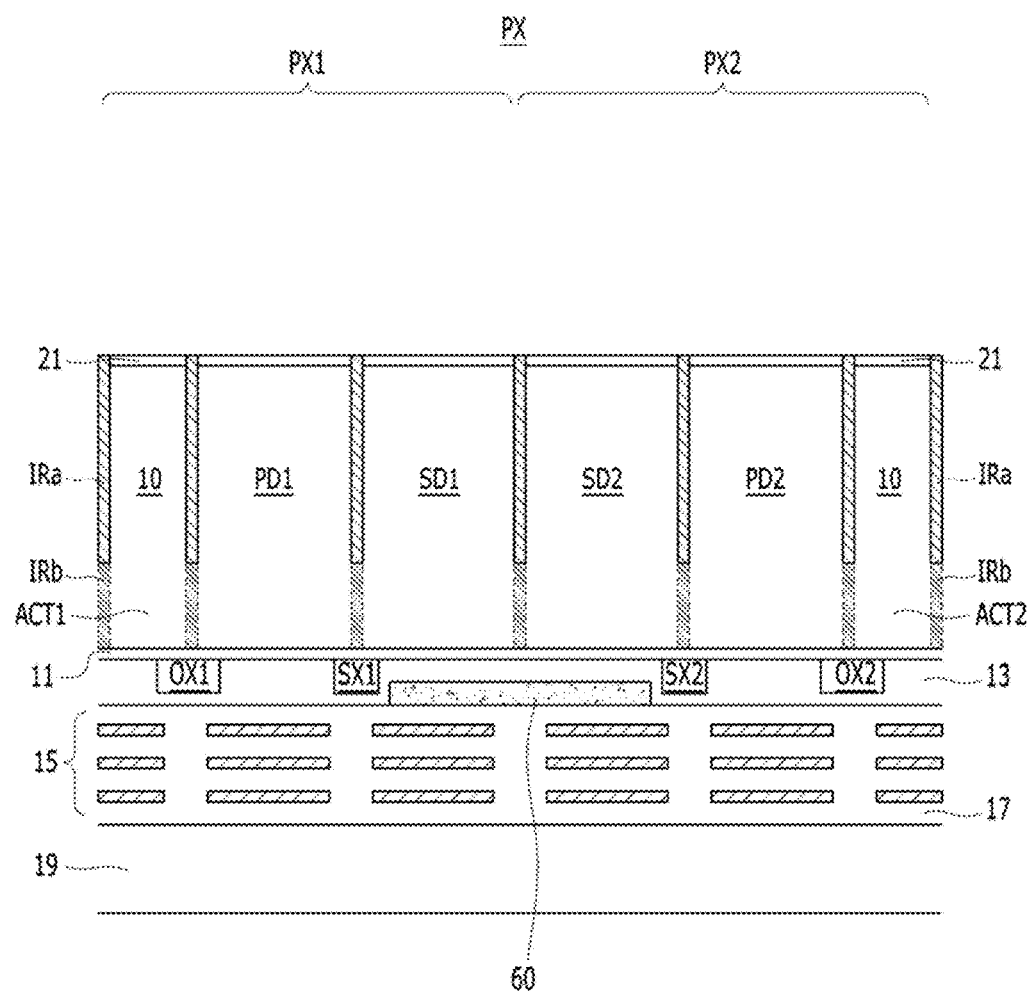

Referring to FIG. 10H, the method for fabricating the image sensor in accordance with the embodiment of the inventive concepts may include forming an upper isolation region IRa by filling the trenches T with a dielectric material and performing a Chemical Mechanical Polishing (CMP) process.

Figure 10I:
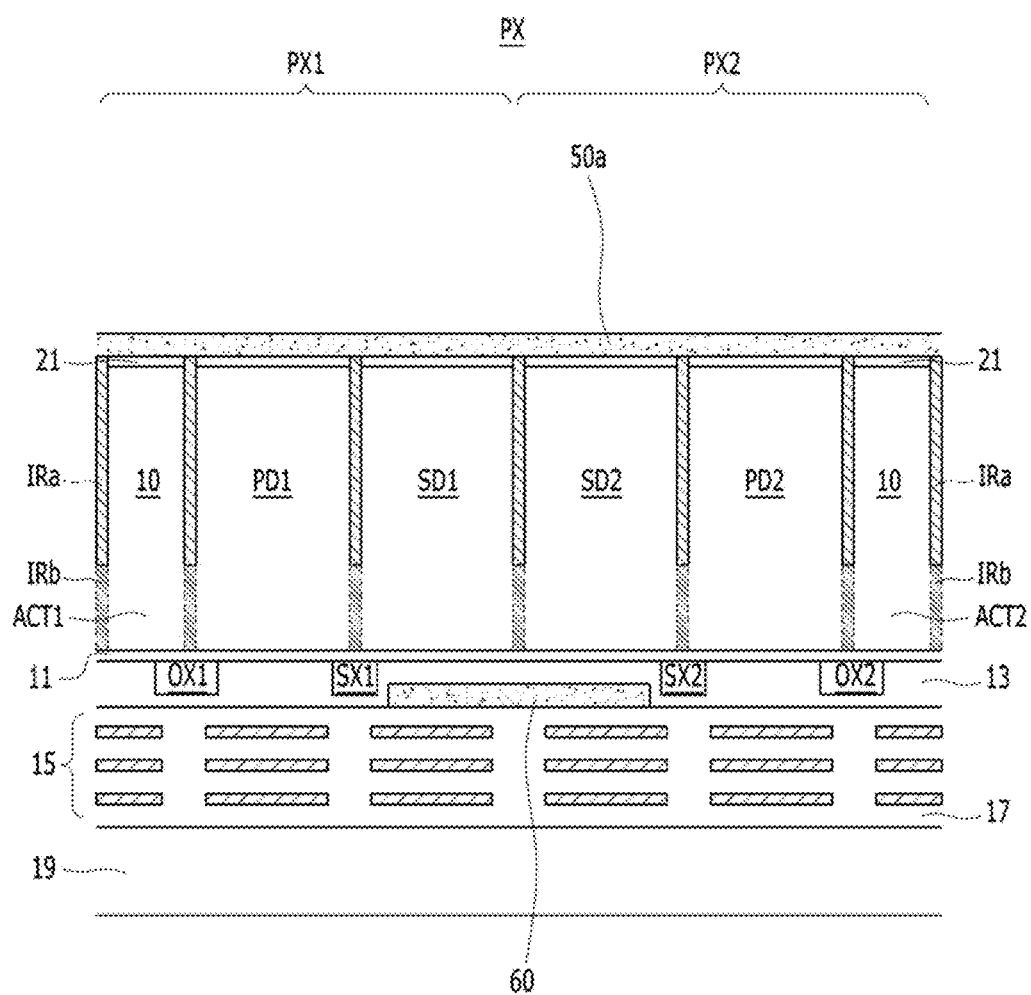

Referring to FIG. 10I, the method for fabricating the image sensor in accordance with the embodiment of the inventive concepts may include forming a shielding material layer 50a over the profile of the upper surface of the substrate 10 by performing a deposition process. The shielding material layer 50a may include a single metal layer, such as tungsten (W), or a double metal layer, such as a titanium nitride (TIN) and tungsten (W).

Figure 10J:
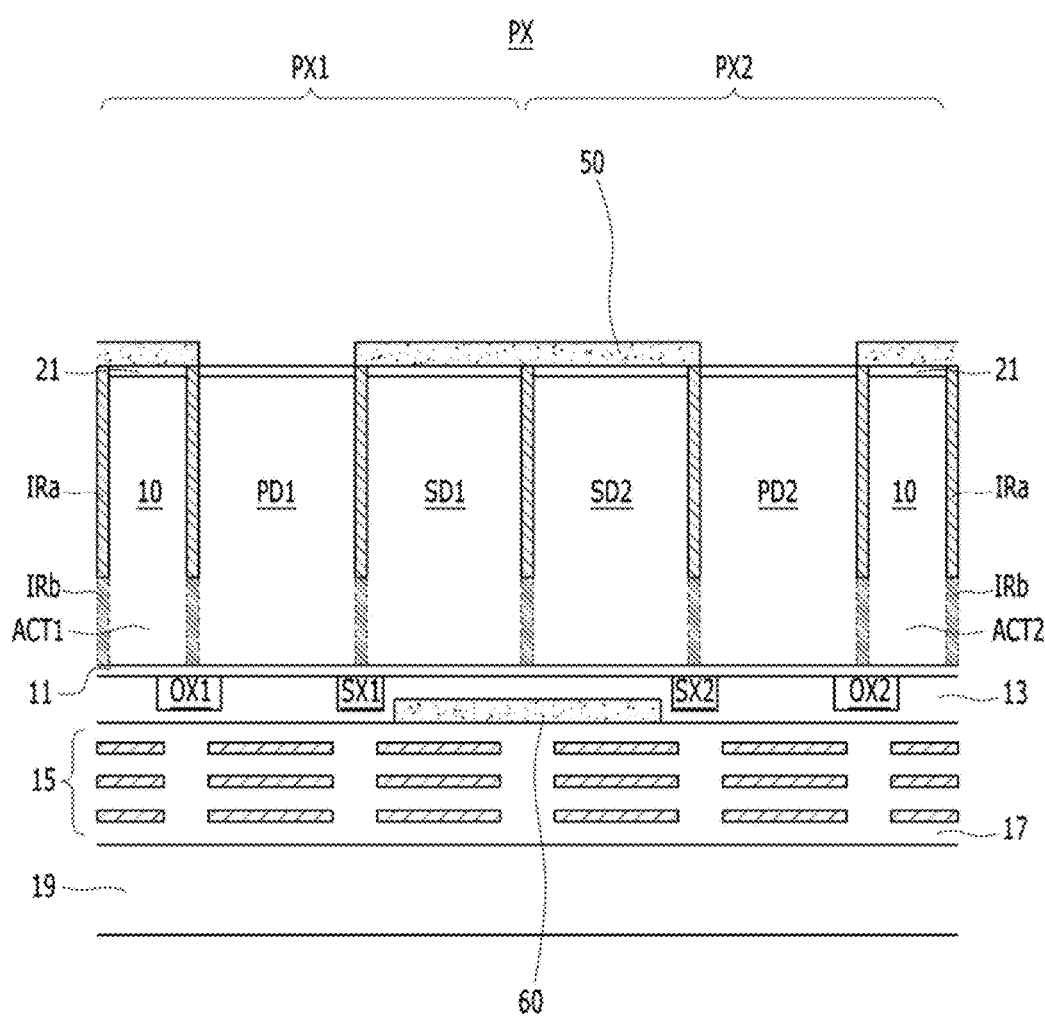

Referring to FIG. 10J, the method for fabricating the image sensor in accordance with the embodiment of the inventive concepts may include forming an upper shield 50 that opens and exposes the first and second photodiodes PD1 and PD2 by performing and etch process and shields the first and second storage diodes SD1 and SD2 and the first and second active regions ACT1 and ACT2. Through the process, the grid pattern 55 illustrated in FIG. 5F may be formed concurrently.

Referring to FIG. 10K, the method for fabricating the image sensor in accordance with the embodiment of the inventive concepts may Include forming a color filter CF over the upper shield 50 and the opened first and second photodiodes PD1 and PD2 by performing a coating process.

The color filter CF may have the same color in the inside of one unit pixel PX. In other words, the first sub-pixel PX1 and the second sub-pixel PX2 may include a color filter CF of the same color.

Subsequently, referring back to FIG. 4, the method for fabricating the image sensor in accordance with the embodiment of the inventive concepts may include forming first and second micro lenses ML1 and ML2 over the color filter CF. Each of the first and second micro lenses ML1 and ML2 may be formed in each of the first and second sub-pixels PX1 and PX2. In other words, the unit pixel PX may include the micro lenses ML1 and ML2 as many as the sub-pixels PX1 and PX2.

Figure 11:
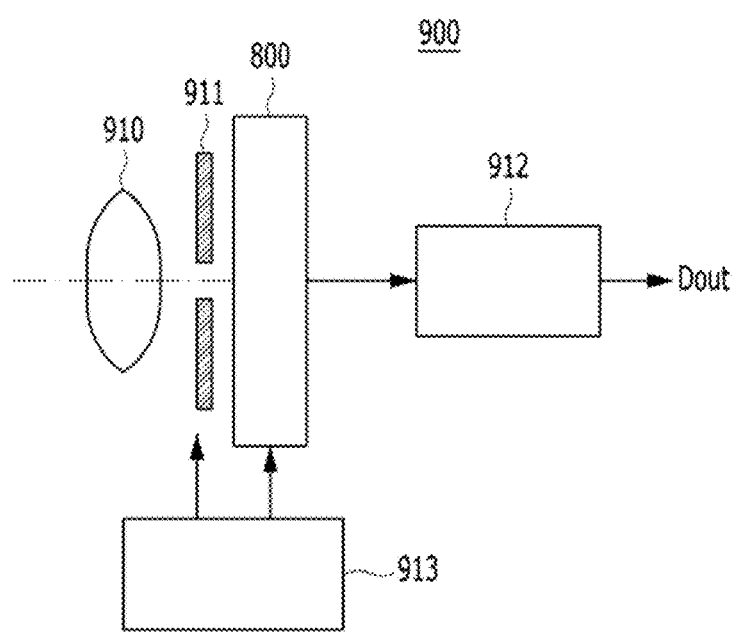
FIG. 11 is a block diagram illustrating an electronic device including at least one image sensor in accordance with exemplary embodiments of the inventive concepts.

FIG. 11 is a block diagram illustrating an electronic device 900 including at least one image sensor 800 in accordance with the various embodiments of the inventive concepts.

Referring to FIG. 11, the electronic device 900 including at least one image sensor 800 in accordance with the various embodiments of the inventive concepts may include a camera capable of taking a still image or a moving picture. The electronic device 900 may include an optical system 910 (or an optical lens), a shutter unit 911, an image sensor 800, and a controller 913 for controlling/driving the shutter unit 911, and a signal processor 912.

The optical system 910 may guide optical image from a subject to a pixel array (refer to a reference numeral "810" of FIG. 1) of the image sensor 800. The optical system 910 may include a plurality of optical lenses. The shutter unit 911 may control the length of time for exposing the image sensor 800 to light and shutting it off. The controller 913 may control a transfer operation of the image sensor 800 and a shutter operation of the shutter unit 911. The signal processor 912 may process various kinds of signals outputted from the image sensor 800. Image signals Dout outputted after the signal processing may be stored in a storage medium, such as a memory, or outputted to a monitor.

The image sensors 800 in accordance with the various embodiments of the inventive concepts may have both auto-focusing function and global shutter function.

The image sensors 800 in accordance with the various embodiments of the inventive concepts may have shields so that some of the photodiodes may be used as storage elements. In this way, the global shutter function may be realized without requiring additional storage elements formed therein.

Other effects of the various embodiments of the inventive concepts that are not described herein may be understood from the detailed description of the inventive concepts.

While the inventive concepts have been described with respect to specific embodiments, it will be apparent to those skilled in the art that various changes and modifications may be made without departing from the spirit and scope of the invention as defined in the following claims.

What is claimed is:

1. An image sensor, comprising:
    a first sub-pixel and a second sub-pixel that are adjacent to each other; and
    an upper shield;
    a lower shield; and
    an isolation region,
    wherein the first sub-pixel includes a first photodiode and a first storage diode,
    the second sub-pixel includes a second photodiode and a second storage diode,
    the upper shield is formed over the first and second storage diodes to vertically overlap with the first and second storage diodes,
    the isolation region is between the first and second photodiodes and between the first and second storage diodes,
    the isolation region includes an upper isolation region and a lower isolation region vertically overlapped and aligned with each other,
    the upper isolation region includes a dielectric material filling trenches which are formed from an upper surface of the substrate to an inside of the substrate,
    the lower isolation region formed from a lower surface of the substrate to the inside of the substrate, and
    the lower isolation region includes an ion implantation region containing a P-type ion,
    wherein the first sub-pixel further includes a first active region,
    the second sub-pixel further includes a second active region, and
    the upper shield is aligned and overlaps with the first and second active regions,
    wherein the lower shield vertically overlaps with the first and second storage diodes and does not vertically overlap with the first and second active regions.

2. The image sensor of claim 1, wherein the upper shield does not vertically overlap with the first and second photodiodes.

3. The image sensor of claim 1, wherein the lower shield does not vertically overlap with the first and second photodiodes.

4. The image sensor of claim 1, further comprising:
    a first micro lens that vertically overlaps with the first sub-pixel; and
    a second micro lens that vertically overlaps with the second sub-pixel.

5. The image sensor of claim 1, further comprising:
    a first storage transfer transistor that is formed over an interface between the first photodiode and the first storage diode; and
    a second storage transfer transistor that is formed over an interface between the second photodiode and the second storage diode.

6. An image sensor, comprising:
    a pixel array including a plurality of pixel sets that are arrayed in a form of matrix, and
    an isolation region isolating the plurality of pixel sets, wherein:
    each of the plurality of the pixel sets includes four unit pixels, and each of the four unit pixels includes a first sub-pixel, a second sub-pixel, an upper shield, and a lower shield, and
    the first sub-pixel includes a first photodiode, a first storage diode, and a first active region adjacent to each other in a top view,
    the second sub-pixel includes a second photodiode, a second storage diode, and a second active region adjacent to each other in the top view,
    the isolation region horizontally isolates the first photo diode, the first storage diode, and the first active region from each other, and the second photodiode, the second storage diode, and the second active region from each other,
    the upper shield optically shields upper surfaces of the first and second storage diodes and the first and second active regions, and the lower shield optically shields lower surfaces of the first and second storage diodes.

7. The image sensor of claim 6, wherein each of the four unit pixels has an arrangement of the first photodiode-the first storage diode-the second storage diode-the second photodiode in a first direction.

8. The image sensor of claim 6, wherein the four unit pixels are arrayed in a form of a checker board shape.

9. The image sensor of claim 6, wherein the first photodiode and the first storage diode share a first micro lens, and the second photodiode and the second storage diode share a second micro lens.

10. An image sensor, comprising:
a plurality of unit pixels, each of the unit pixels including a first sub-pixel, a second sub-pixel, an upper shield, and a lower shield,
wherein:
the first sub-pixel includes a first photodiode, a first storage diode, a first active region, and a first micro lens,
the second sub-pixel includes a second photodiode, a second storage diode, a second active region, and a second micro lens,
the first micro lens vertically overlaps with the first photodiode, the first storage diode, and the first active region,
the second micro lens vertically overlaps with the second photodiode, the second storage diode, and the second active region,
the upper shield optically shields upper surfaces of the first and second storage diodes and the first and second active regions, and
the lower shield optically shields lower surfaces of the first and second storage diodes,
wherein the first photodiode, the first storage diode, and the first active region are arrayed to be adjacent to each other, and the second photodiode, the second storage diode, and the second active region are arrayed to be adjacent to each other in a top view.

11. The image sensor of claim 10,
wherein the first sub-pixel further includes a first color filter, and the second sub-pixel further includes a second color filter, and
wherein the first photodiode, the first storage diode, and the first active region vertically overlap with the first color filter, and the second photodiode, the second storage diode, and the second active region vertically overlap with the second color filter.

12. The image sensor of claim 11, wherein the first color filter and the second color filter are a same color.

13. The image sensor of claim 10, wherein the first sub-pixel and the second sub-pixel are arrayed in a mirroring form.

14. The image sensor of claim 10, wherein the first sub-pixel and the second sub-pixel are arrayed in a same form.

15. The image sensor of claim 10, wherein the first and second active regions include a source/drain region, a floating diffusion, and a contact region, respectively.

16. The image sensor of claim 10, further comprising an isolation region between the first sub-pixel and the second sub-pixel,
wherein the isolation regions include an upper isolation region and a lower isolation region vertically aligned with each other.

* * * * *